United States Patent
Haraguchi

(10) Patent No.: US 6,930,940 B2
(45) Date of Patent: Aug. 16, 2005

(54) SEMICONDUCTOR MEMORY DEVICE WITH READ AND/OR WRITE COLUMN SELECT GATE

(75) Inventor: Masaru Haraguchi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/678,137

(22) Filed: Oct. 6, 2003

(65) Prior Publication Data

US 2004/0196692 A1 Oct. 7, 2004

(30) Foreign Application Priority Data

Feb. 3, 2003 (JP) ........................................ 2003-025499

(51) Int. Cl.$^7$ ................................................. G11C 7/00
(52) U.S. Cl. .................................. 365/203; 365/189.01
(58) Field of Search ............................ 365/203, 189.01, 365/230.06, 231, 189.009

(56) References Cited

U.S. PATENT DOCUMENTS 6,333,889 B1 * 12/2001 Arimoto ................. 365/230.03

FOREIGN PATENT DOCUMENTS

JP    P2000-90663 A    3/2000

* cited by examiner

*Primary Examiner*—Thong Q. Le
(74) *Attorney, Agent, or Firm*—McDermott Will & Emery LLP

(57) ABSTRACT

The DRAM drives a bit line pair connected to a read column select gate and a write column select line connected to a write column select gate by a power supply voltage for an array, and drives a read column select line connected to a read column select gate and write data line pair connected to a write column select gate by a power supply voltage for a peripheral circuitry. Hence, even when one power supply voltage becomes high and another power supply voltage becomes low at the same time, the timing margin and operation margin can sufficiently be secured. Thus, a semiconductor memory device allowing a stable high-speed operation with large timing margin and operation margin will be achieved.

4 Claims, 14 Drawing Sheets

SEMICONDUCTOR MEMORY DEVICE WITH READ AND/OR WRITE COLUMN SELECT GATE

BACKGROUND OF THE INVENTION

1. Field of the Invention

The present invention relates to a semiconductor memory device, in particular to a semiconductor memory device driven by two power supply potentials supplied independently from each other and a reference potential.

2. Description of the Background Art

A semiconductor memory device such as a dynamic random access memory (hereinafter referred to as DRAM), which utilizes a minor potential difference by amplifying it, includes a voltage down converter for generating a power supply voltage for an array to achieve a stable operation. For saving the power consumption, peripheral circuitry is driven by a dedicated power supply voltage which is directly connected to an external source. In the conventional DRAM, a read column select line and a write column select line are driven by a power supply voltage, either the power supply voltage for the array or the power supply voltage for the peripheral circuitry.

Along with the miniaturization of the semiconductor integrated circuit according to the scaling law, the power supply voltage has been decreased. Hence, the fluctuation of drivability of the transistor caused by the fluctuation of gate length and threshold voltage in the manufacturing process has become apparent, and the fluctuation in operating voltage causes a significant change in the switching characteristics and the operation speed of the circuit of the transistor. The power supply voltage for the array and the power supply voltage for the peripheral circuitry, though with the same standard value, vary according to the voltage drop and disturbance during the operation.

To solve the problems as described above, it has been proposed that the select level of a column select signal supplied to the gate of an MOS transistor, which connects a bit line and a data line, be set to a voltage according to a variation of a power supply voltage supplied from an external terminal at the low voltage side in the normal operation range, and be set to a voltage according to a variation of a down-converted voltage at the high voltage side in the normal operation range, to achieve a stable high-speed operation (for example, see Japanese Patent-Laying Open No. 2000-90663).

In a conventional DRAM where a read column select line and a write column select line are driven by the same power supply voltage, when the read column select line and the write column select line are driven by the power supply voltage for the array, a bit line pair and the read column select line both connected to a read column select gate are driven by the power supply voltage for the array. Hence, when the power supply voltage for the array decreases and the power supply voltage for the peripheral circuitry increases, the speed that electric charge is drawn from the read data line is lowered. However, the delay amount of a pre-amp activation signal generated by the power supply voltage for the peripheral circuitry is small, and an erroneous operation can happen such as the activation of preamplifier while the potential difference between read data lines of a read data line pair is small, which means that the timing margin is not sufficient. However, if, as a solution, the delay amount of the pre-amp activation signal is increased, the operating frequency becomes lower.

In addition, when the read column select line and the write column select line are both driven by the power supply voltage for the peripheral circuitry, the write column select line and a write data line pair, both connected to a write column select gate, are driven by the power supply voltage for the peripheral circuitry. Hence, with the increase of the power supply voltage for the array and the decrease of the power supply voltage for the peripheral circuitry, data inversion cannot always be caused due to the low drivability of the write column select gate compared with the drivability of a P-channel MOS transistor of a sense amplifier, thus the operation margin is not sufficient.

Hence, in the conventional DRAM where the read column select line and the write column select line connected to the read column select gate and the write column select gate, respectively, are driven by the same power supply voltage, when one power supply voltage is low and another power supply voltage is high, the timing margin and the operation margin become extremely small, whereby the stable high-speed operation cannot be sufficiently achieved.

SUMMARY OF THE INVENTION

Hence, a main object of the present invention is to provide a semiconductor memory device allowing a stable high-speed operation with a large timing margin and operation margin.

A semiconductor memory device according to the present invention includes: a memory array including a plurality of memory cells arranged in a plurality of rows and a plurality of columns, a plurality of word lines provided corresponding to the plurality of rows, respectively, and a plurality of sets of first bit lines and second bit lines provided corresponding to the plurality of columns, respectively; a sense amplifier provided corresponding to each set of the first and the second bit lines to amplify a potential difference generated between corresponding bit lines to a potential difference between the first power supply potential and the reference potential; a row decoder to select one word line from the plurality of word lines according to a row address signal and to activate each memory cell corresponding to the selected word line; first and second read data lines provided commonly to the plurality of sets of first and second bit lines and previously charged to the second power supply potential; first and second write data lines commonly provided for the plurality of sets of first and second bit lines; a plurality of read column select lines and write column select lines provided corresponding to the plurality of sets of first and second bit lines, respectively; a read column decoder to select one read column select line from the plurality of read column select lines according to a column address signal and to turn the selected read column select line to the second power supply potential at a reading operation; a write column decoder to select one write column select line from the plurality of write column select lines according to a column address signal and to turn the selected write column select line to the first power supply potential at a writing operation; a read column select gate provided corresponding to each set of the first and the second bit lines, in response to an attainment of the second power supply potential by the corresponding read column select line through the read column decoder, to transmit a potential difference of the corresponding set of first and second bit lines to the first and second read data lines; a read circuit to read a data signal of a memory cell selected by the row decoder and the column decoder based on a potential difference of the first and second read data lines. A write circuit to turn one write data line of said first and second write data lines to said second power supply potential and to turn another write data line to said reference potential according to an external data signal; and a write column select gate provided corresponding to each set of the first and the second bit lines, in response to an attainment of the first power supply potential by a corresponding write column select line through the write column decoder, to transmit a potential difference of the first and second write data lines to a corresponding set of first and second bit lines. The read column select gate includes first and second transistors, connected in series between the first read data line and a line of the reference potential and a gate electrode of one transistor of the first and second transistors is connected to a corresponding first bit line and a gate electrode of another transistor of the first and second transistors is connected to a corresponding read column select line, and third and fourth transistors, connected in series between the second read data line and the line of the reference potential, a gate electrode of one transistor of the third and fourth transistors is connected to a corresponding second bit line and a gate electrode of another transistor is connected to a corresponding read column select line. The write column select gate includes fifth and sixth transistors connected in series between a corresponding first bit line and a line of the reference potential, a gate electrode of one transistor of the fifth and sixth transistors is connected to a corresponding write column select line and a gate electrode of another transistor of the fifth and sixth transistors is connected to the first write data line, and seventh and eighth transistors connected in series between a corresponding second bit line and the line of the reference potential, a gate electrode of one transistor of the seventh and eighth transistors is connected to a corresponding write column select line and a gate electrode of another transistor of the seventh and eighth transistors is connected to the second write data line.

Hence, the bit line pair connected to the read column select gate and the write column select line connected to the write column select gate are driven by the first power supply potential, and the read column select line connected to the read column select gate and write data line pair connected to the write column select gate are driven by the second power supply potential, whereby even when the first power supply potential becomes low and the second power supply potential becomes high at the same time, a sufficient timing margin and operation margin can be secured. Thus, a semiconductor memory device allowing a stable high-speed operation with a large timing margin and operation margin will be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
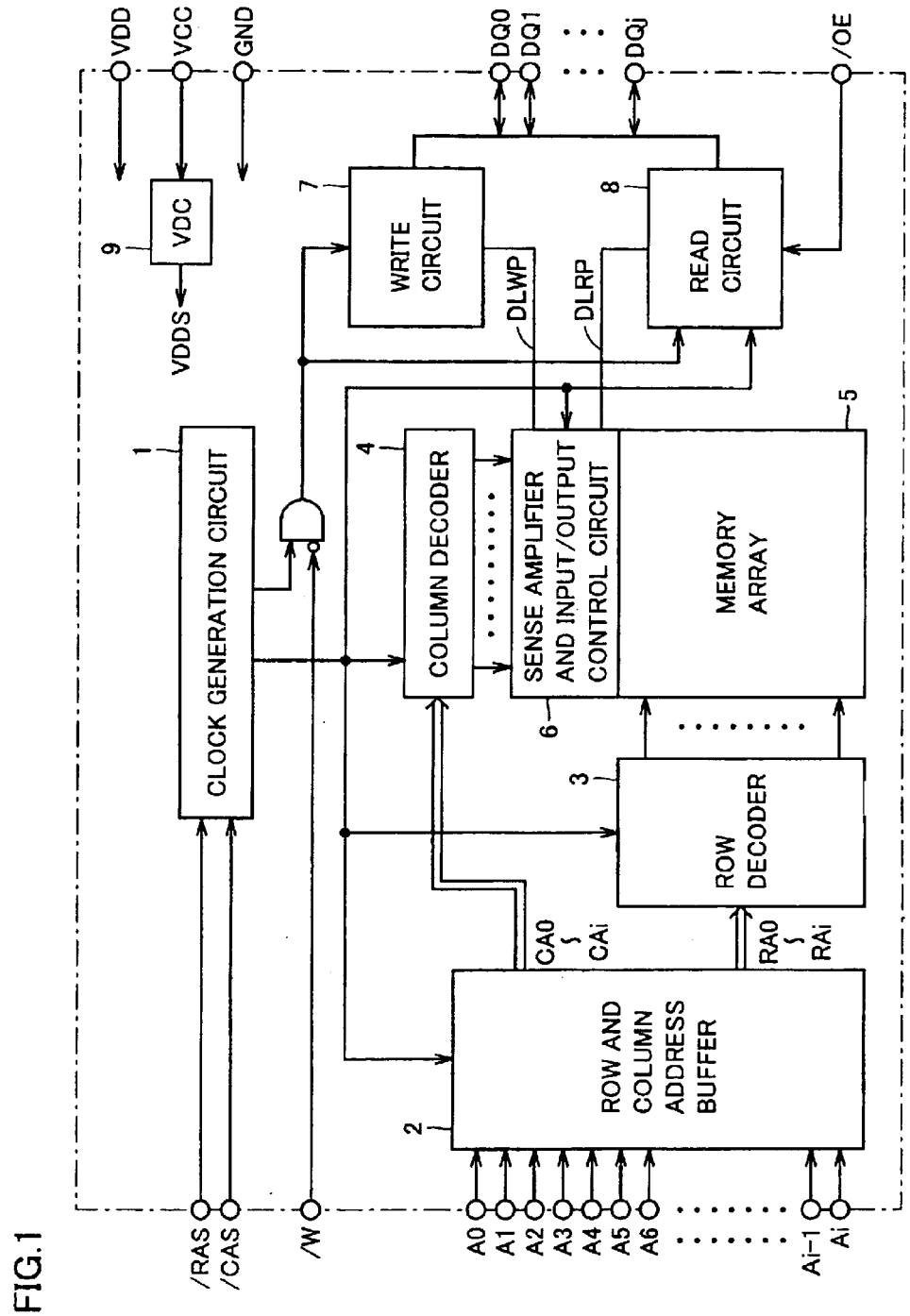
FIG. 1 is a block diagram showing an overall configuration of a DRAM according to a first embodiment of the present invention.

FIG. 1 is a block diagram showing an overall configuration of a DRAM according to the first embodiment of the present invention. In FIG. 1, the DRAM includes a clock generation circuit 1, a row and column address buffer 2, a row decoder 3, a column decoder 4, a memory array 5, a sense amplifier and input/output control circuit 6, a write circuit 7, a read circuit 8 and a voltage down circuit (VDC) 9.

Clock generation circuit 1 selects a predetermined operation mode according to external control signals /RAS, /CAS and controls the whole DRAM. Row and column address buffer 2 generates row address signals RA0~RAi (here, "i" is an integer equal to or larger than 0) and column address signals CA0~CAi according to external address signals A0~Ai, and supplies signals RA0~RAi and CA0~CAi to row decoder 3 and column decoder 4, respectively.

Memory array 5 includes a plurality of memory cells each storing 1-bit data. Each memory cell is arranged at a predetermined address determined by a row address and a column address.

Row decoder 3 designates a row address of memory array 5 according to row address signals RA0~RAi supplied from row and column address buffer 2. Column decoder 4 designates a column address of memory array 5 according to column address signals CA0~CAi supplied from row and column address buffer 2.

Sense amplifier and input/output control circuit 6 connects a memory cell, which is at an address designated by row decoder 3 and column decoder 4, to one end of a write data line pair DLWP and to one end of a read data line pair DLRP. Another end of write data line pair DLWP is connected to write circuit 7 and another end of read data line pair DLRP is connected to read circuit 8. In a writing operation, write circuit 7 supplies, in response to an external control signal /W, an externally-input write data signal Dj (here, "j" is an integer equal to or larger than 0) to a selected memory cell via write data line pair DLWP. In a reading operation, read circuit 8 externally outputs via read data line pair DLRP, in response to an external control signal /OE, a read data signal Qj supplied from a selected memory cell. VDC 9 pulls down an external power supply potential VCC to generate a power supply potential VDDS for the array. The DRAM is driven by power supply potential VDDS for the array and power supply potential VDD for the peripheral circuitry, supplied independently from each other, and a ground potential GND.

Figure 2:
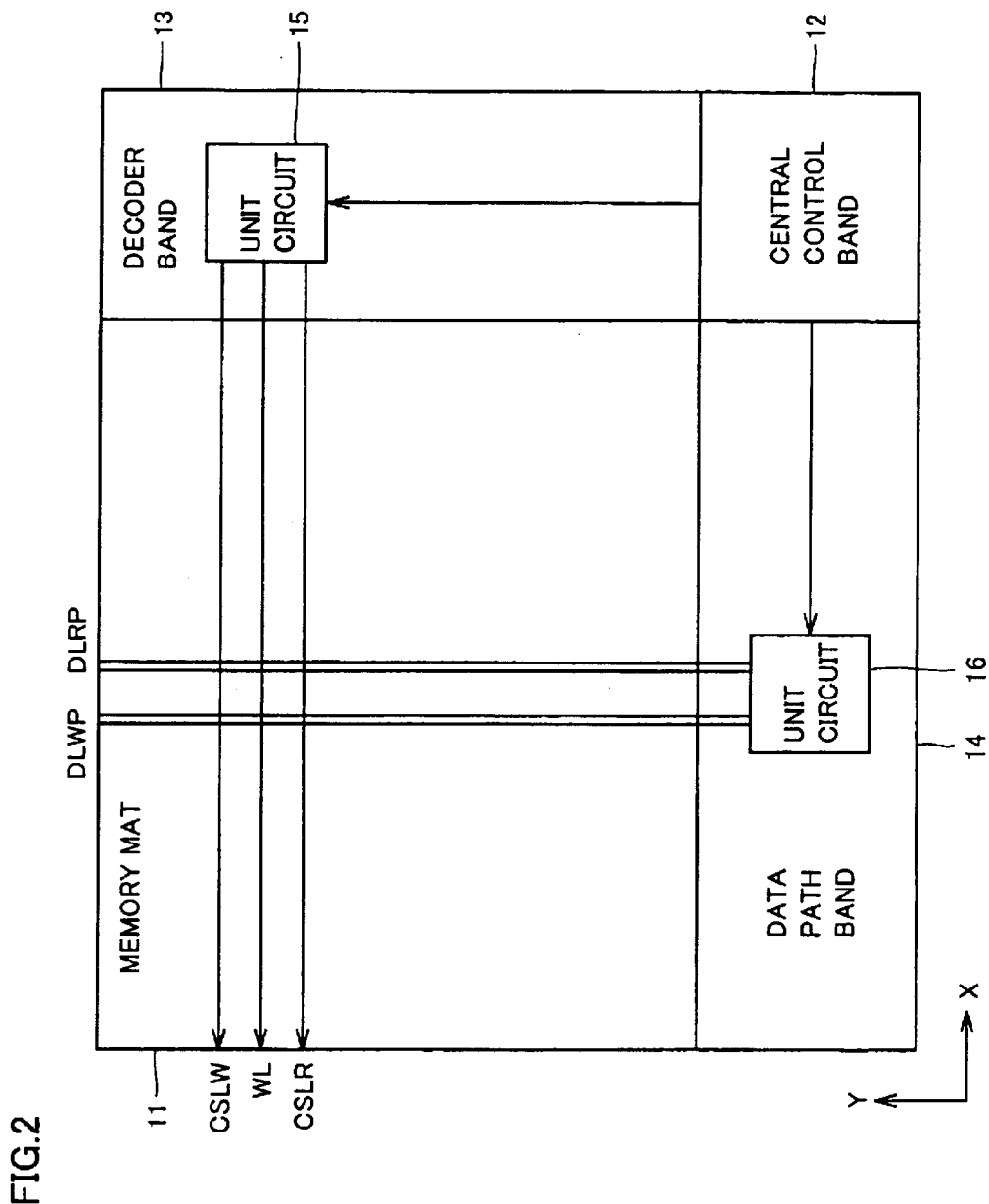
FIG. 2 is a diagram showing a layout of the DRAM of FIG. 1.

FIG. 2 shows a layout of the DRAM shown in FIG. 1. In FIG. 2, DRAM is arranged across a memory mat 11, a central control band 12, a decoder band 13 and a data path band 14.

On memory mat 11, memory array 5 and sense amplifier and input/output control circuit 6 shown in FIG. 1 are arranged. Further, on central control band 12, clock generation circuit 1 and row and column address buffer 2 are arranged, on decoder band 13, row decoder 3 and column decoder 4 are arranged and on data path band 14, write circuit 7 and read circuit 8 are arranged.

Row decoder 3 and column decoder 4 are formed from a plurality of decoder band unit circuits 15's and write circuit 7 and read circuit 8 are formed from a plurality of data path band unit circuits 16's. A write column select line CSLW and a read column select line CSLR are arranged as to extend in the X-axis direction (the direction of the extension of word line WL) according to a CSL lateral arrangement. Write data line pair DLWP and read data line pair DLRP are arranged in the Y-axis direction.

Figure 3:
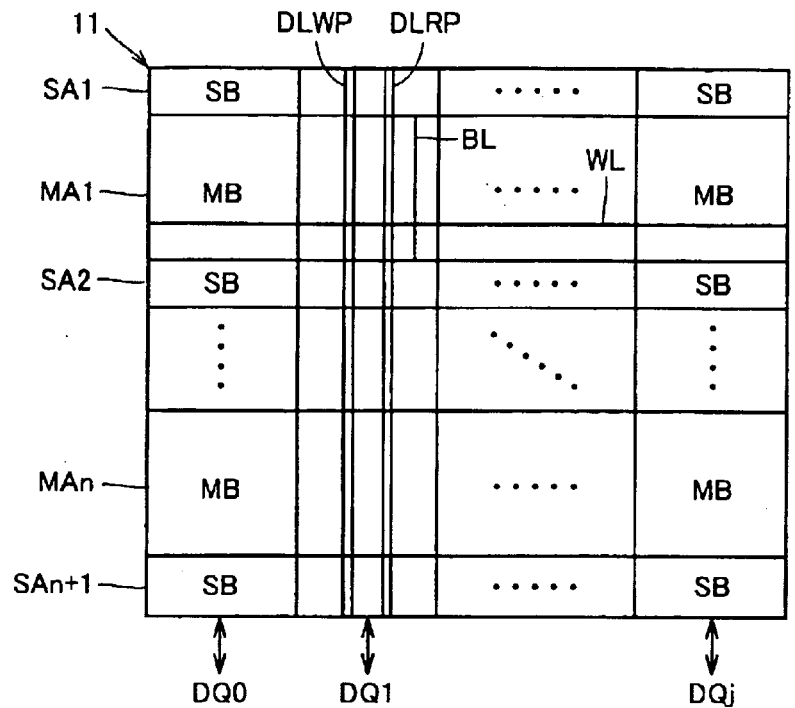
FIG. 3 is a block diagram showing a configuration of a memory mat 11 shown in FIG. 2.

FIG. 3 is a block diagram showing a configuration of memory mat 11 shown in FIG. 2. In FIG. 3, memory mat 11 is provided with n sets (here, "n" is an integer equal to or larger than 1) of memory arrays MA1~MAn and sense amplifier bands SA1~SAn+1 arranged between and beside memory array MA1~MAn. Each of memory array MA1~MAn is divided into j+1 memory blocks MB's corresponding respectively to data signals DQ0~DQj. Further, each of sense amplifier band SA1~SAn+1 is divided into j+1 sense blocks SB corresponding to data signals DQ0~DQj.

Memory mat 11 is provided with j+1 read data line pairs DLRP's for reading out read data signals Q0~Qj, respectively, and j+1 write data line pairs DLWP's for writing in write data signals D0~Dj, respectively. Read data line pairs DLRP's and write data line pairs DLWP's are arranged across corresponding plurality of sense blocks SB's and plurality of memory blocks MB's and one ends thereof are connected to data path band unit circuit 16.

Figure 4:
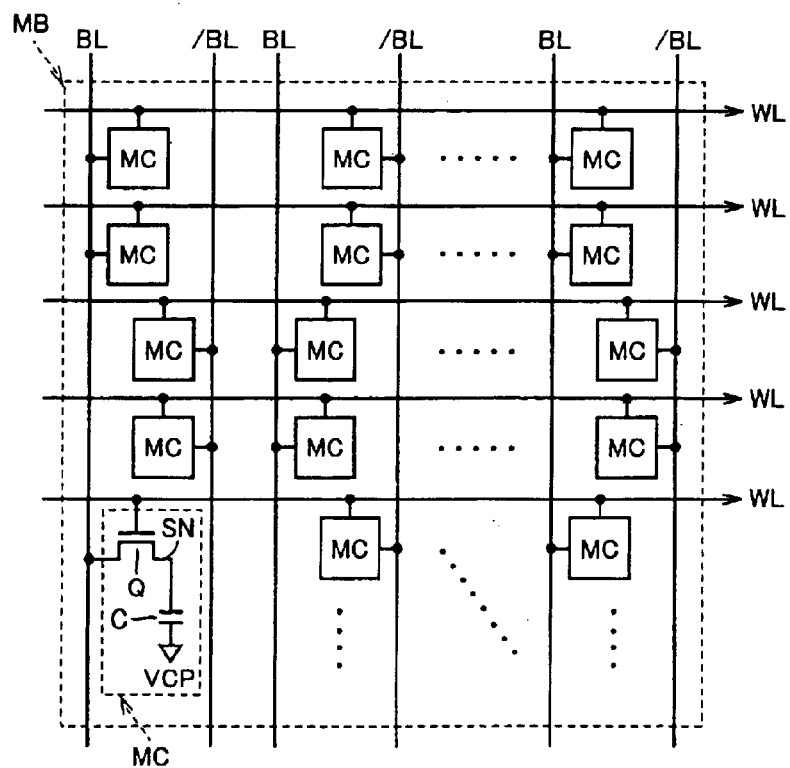
FIG. 4 is a diagram showing a configuration of a memory block MB shown in FIG. 3.

As shown in FIG. 4, memory block MB includes a plurality of memory cells MC's arranged in a plurality of rows and a plurality of columns, a plurality of word lines WL's provided corresponding to the plurality of rows, respectively, and a plurality of bit line pairs BL's, /BL's provided corresponding to the plurality of columns, respectively. Memory cell MC includes an N channel MOS transistor Q used for an access and a capacitor C used for information storage. A gate of N channel MOS transistor Q of memory cell MC is connected to a word line WL of a corresponding row. N channel MOS transistor Q is connected between a bit line BL of a corresponding column and one electrode (a storage node SN) of capacitor C of corresponding memory cell MC. Another electrode of capacitor C of memory cell MC receives a cell plate potential VCP. Word line WL transfers an output from decoder band unit circuit 15 and activates memory cell MC of a selected row. Bit line pair BL, /BL inputs/outputs data signal for a selected memory cell MC.

When word line WL is turned to an 'H' level which is a select level, N channel MOS transistor Q of each memory cell MC in the corresponding row to the word line WL becomes conductive to allow the writing and reading of data to/from each memory cell MC. At the time of writing operation, one word line WL is turned to an 'H' level which is a select level to activate memory cell MC, then according to a corresponding write data signal Dj, one bit line of one bit line pair BL, /BL is turned to an 'H' level and another bit line of the bit line pair is turned to an 'L' level. Thus, the potential of the bit line is written into an intended memory cell MC.

At the time of reading operation, the potential of bit line pair BL, /BL is equalized with a bit line precharge potential VBL (=VDDS/2) and one word line WL is turned to an 'H' level which is a select level to make N channel MOS transistor Q of memory cell MC conductive. Thus, a minor potential difference is created between bit lines of each bit line pair BL, /BL corresponding to stored data in memory cell MC. After the minor potential difference between bit lines of each bit line pair BL, /BL is amplified to power supply voltage VDDS for the array, the potential difference between one bit line pair BL, /BL is detected to allow the reading of a data signal from an intended memory cell MC.

Figure 5:
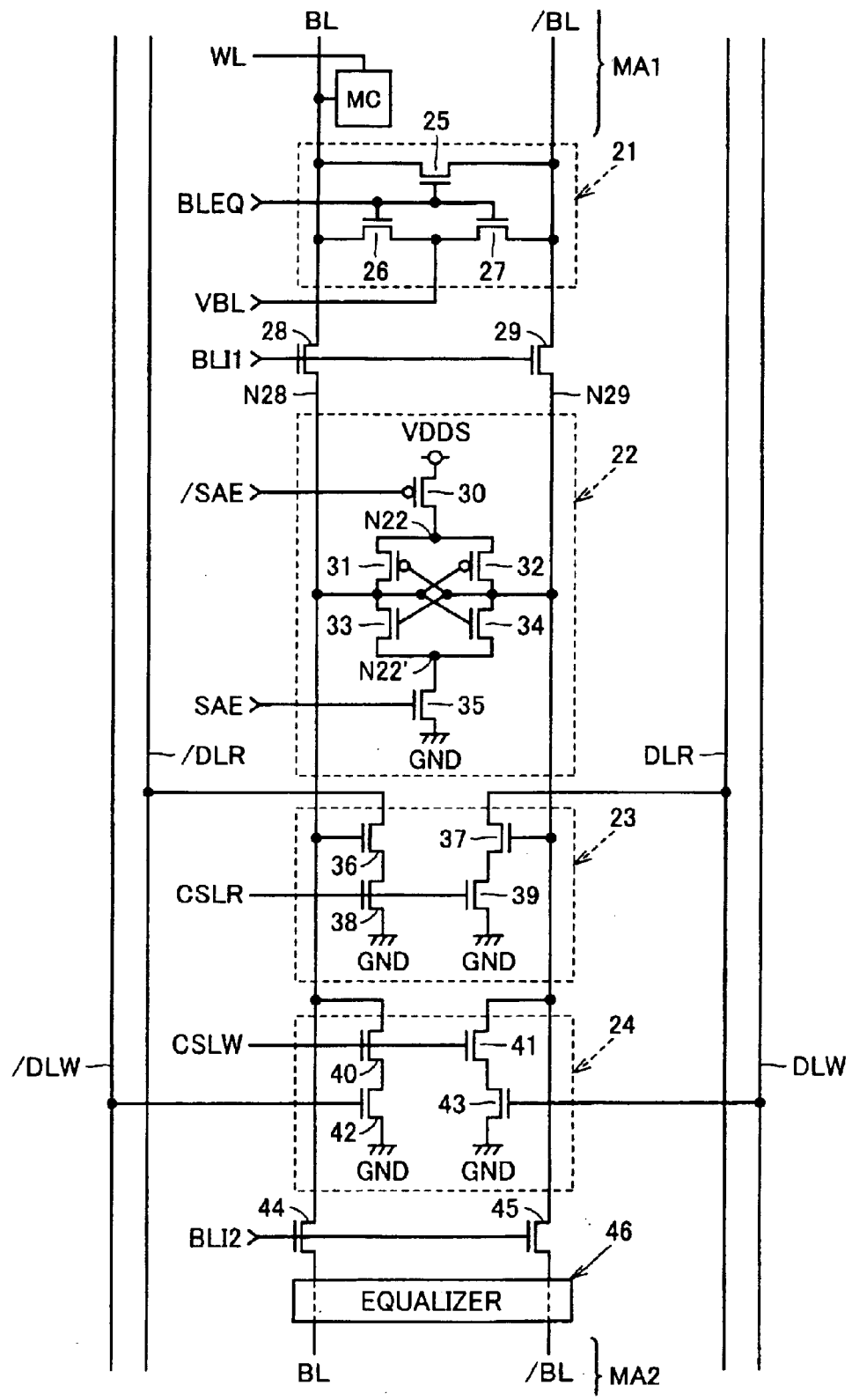
FIG. 5 is a circuit diagram showing in detail a configuration of one column of a sense amplifier band SA2 shown in FIG. 3.

FIG. 5 is a circuit diagram showing in detail a configuration of one column in sense amplifier band SA2 shown in FIG. 3. In FIG. 5, a column of sense amplifier band SA2 is provided corresponding to a column (one bit line pair BL, /BL) in memory block MB shown in FIG. 4.

Bit line pair BL, /BL and write column select line CSLW are driven by power supply voltage VDDS for the array, whereas read column select line CSLR, read data line pair /DLR, DLR and write data line pair /DLW, DLW are driven by power supply voltage VDD for the peripheral circuitry.

Memory cell MC is of a well-known type and has been described with reference to FIG. 4. An equalizer 21 includes N channel MOS transistors 25~27. N channel MOS transistor 25 is connected between bit lines BL, /BL of a bit line pair of memory array MA1, and N channel MOS transistor 26 and 27 are connected in series between bit lines BL, /BL of the bit line pair of memory array MA1. Gates of N channel MOS transistors 25~27 all receive bit line equalize signal BLEQ. A node between N channel MOS transistors 26 and 27 receives a bit line precharge potential VBL (=VDDS/2). When bit line equalize signal BLEQ is turned to an 'H' level which is an activation level, N channel MOS transistors 25~27 become conductive, to equalize the potential of bit line pair BL, /BL to a bit line precharge potential VBL, whereas when bit line equalize signal BLEQ is turned to an 'L' level, N channel MOS transistors 25~27 become nonconductive, to stop the equalization of bit line pair BL, /BL. An equalizer 46 is of the same configuration as equalizer 21 and is connected to bit line pair BL, /BL of memory array MA2.

N channel MOS transistors 28 and 29 are connected between bit line BL, /BL of memory array MA1 and nodes N28 and N29, respectively, and the gates thereof both receive an array select signal BLI1. Further, N channel MOS transistors 44 and 45 are connected between nodes N28 and N29 and bit lines BL, /BL of memory array MA2, respectively, and the gate thereof both receive an array select signal BLI2. When array select signal BLI1 is turned to an 'H' level, N channel MOS transistors 28 and 29 become conductive to couple bit lines BL, /BL of memory array MA1 and nodes N28 and N29, respectively, whereas when array select signal BLI1 is turned to an 'L' level, N channel MOS transistors 28 and 29 become nonconductive to electrically separate bit lines BL, /BL of memory array MA1 from nodes N28 and N29, respectively. Further, when array select signal BLI2 is turned to an 'H' level, N channel MOS transistors 44 and 45 become conductive to couple nodes N28 and N29 and bit lines BL, /BL of memory array MA2, respectively, whereas when array select signal BLI2 is turned to an 'L' level, N channel MOS transistors 44 and 45 become nonconductive to electrically separate nodes N28 and N29 from bit lines BL, /BL of memory array MA2.

Sense amplifier 22 includes P channel MOS transistors 31 and 32 connected between nodes N28 and N29 and a node N22, respectively, N channel MOS transistors 33 and 34 connected between nodes N28 and N29 and a node N22' respectively, P channel MOS transistor 30 connected between a line of power supply potential VDDS for the array and node N22, and an N channel MOS transistor 35 connected between node N22' and a line of ground potential GND. The gates of MOS transistors 31 and 33 are both connected to node N29 and the gates of MOS transistors 32 and 34 are both connected to node N28. The gates of MOS transistors 30 and 35 receive sense amplifier activation signals /SAE, SAE, respectively. Sense amplifier 22, in response to the change of sense amplifier activation signals /SAE and SAE to an 'L' level and an 'H' level, respectively, amplifies a minor potential difference AV between nodes N28 and N29, that is, between bit lines of bit line pair BL, /BL to power supply voltage VDDS for the array.

Read column select gate 23 includes N channel MOS transistors 36 and 38 connected in series between read data line /DLR and the line of ground potential GND and N channel MOS transistors 37 and 39 connected in series between read data line DLR and the line of ground potential GND. The gates of N channel MOS transistors 36 and 37 are connected to nodes N28 and N29, respectively, and the gates of N channel MOS transistors 38 and 39 are both connected to read column select line CSLR.

Read data lines /DLR and DLR are both precharged to an 'H' level potential (VDD). Decoder band unit circuit 15 turns read column select line CSLR to a select level of an 'H' level (VDD), to render N channel MOS transistors 38 and 39 conductive. When the potential of nodes N28 and N29 are at an 'H' level (VDDS) and an 'L' level (GND), respectively, N channel MOS transistor 36 is rendered conductive, and N channel MOS transistor 37 is rendered non-conductive, thereby lowering the potential of read data line /DLR. When the potential of nodes N28 and N29 are at an 'L' level (GND) and 'H' level (VDDS), respectively, N channel MOS transistor 37 is rendered conductive and N channel MOS transistor 36 is rendered nonconductive, thereby lowering the potential of read data line DLR.

Write column select gate 24 includes N channel MOS transistors 40 and 42 connected in series between node N28 and the line of ground potential GND, and N channel MOS transistors 41 and 43 connected in series between node N29 and the line of ground potential GND. The gates of N channel MOS transistors 40 and 41 are connected to write column select line CSLW and the gates of N channel MOS transistors 42 and 43 are connected to write data lines /DLW and DLW, respectively.

When write column select line CSLW is turned to a select level, which is an 'H' level (VDDS), by decoder band unit circuit 15, N channel MOS transistors 40 and 41 become conductive. When write data lines /DLW and DLW attain an 'H' level (VDD) and an 'L' level (GND), respectively, N channel MOS transistor 42 is rendered conductive and N channel MOS transistor 43 is rendered nonconductive, thereby lowering the potential of node N28. When write data lines /DLW and DLW are turned to an 'L' level (GND) and an 'H' level (VDD), respectively, N channel MOS transistor 43 becomes conductive and N channel MOS transistor 42 becomes nonconductive, thereby lowering the potential of node N29.

Other sense amplifier bands SA1, SA3~SAn+1 all have the same configuration as sense amplifier band SA2. However, sense amplifiers included in sense amplifier bands SA1 and SAn+1, which locate at the end, are provided only for memory arrays MA1 and MAn adjacent to them, respectively.

Returning to FIG. 2, clock generation circuit 1 and row and column address buffer 2 arranged in central control band 12 are driven by power supply voltage VDD for the peripheral circuit. Clock generation circuit 1, in response to an externally supplied command signal, outputs a timing signal, a write column decoder enable signal CDEW and a read column decoder enable signal CDER to decoder band unit circuit 15, outputs a data line equalize signal DLEQ, a preamplifier activation signal PAE, a write data latch signal WDLAT, a read clock signal CLKQ and a write clock signal CLKD to data path band unit circuit 16, and outputs bit line equalize signal BLEQ, array select signals BLI1, BLI2 and sense amplifier activation signals /SAE and SAE to sense block SB.

Row and column address buffer 2, in response to an externally supplied address signal, outputs a row address signal RA, a write column predecode address signal YW and a read column predecode address signal YR to decoder band unit circuit 15.

Figure 6:
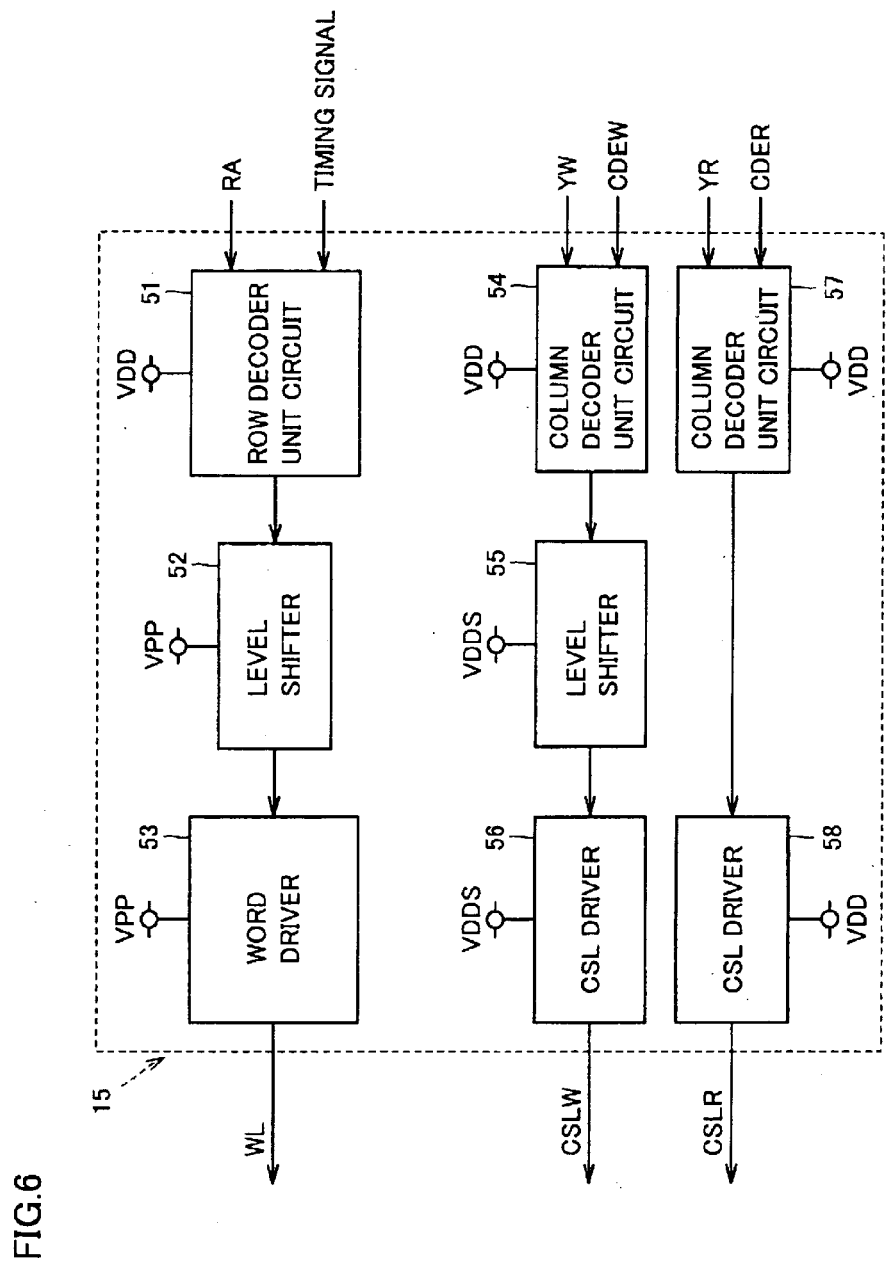
FIG. 6 is a block diagram showing a configuration of a decoder band unit circuit 15 shown in FIG. 2.

In decoder band 13, decoder band unit circuit 15 is arranged corresponding to each combination of word line WL and column select lines CSLW and CSLR. Decoder band unit circuit 15 includes, as shown in FIG. 6, a row decoder unit circuit 51, level shifters 52 and 55, a word driver 53, column decoder unit circuits 54 and 57 and column select line (CSL) drivers 56 and 58.

Row decoder unit circuit 51 which is driven by power supply voltage VDD for the peripheral circuitry is provided corresponding to each word line WL and is activated in response to the change of the state of the timing signal to an 'H' level (VDD). Row decoder unit circuit 51, in response to the input of row address signal RA previously designated to the corresponding word line WL, outputs a signal of an 'H' level (VDD) to level shifter 52. Level shifter 52 which is driven by a boosted voltage VPP, in response to the input of a signal of an 'H' level (VDD) from row decoder unit circuit 51, outputs a signal of an 'H' level (VDD) to word driver 53. Word driver 53 driven by boosted voltage VPP, in response to an input of an 'H' level (VPP) signal from level shifter 52, turns the corresponding word line WL to a select level, that is, an 'H' level (boosted potential VPP). The boost potential VPP is a predetermined potential and higher than the sum of power supply potential VDDS for the array and a threshold voltage Vthn of N channel MOS transistor Q of memory cell MC.

Column decoder unit circuit 54 driven by power supply voltage VDD for the peripheral circuitry is provided corresponding to each write column select line CSLW and is activated in response to the change of write column decoder enable signal CDEW to an 'H' level (VDD). Column decoder unit circuit 54, in response to the input of write column predecode address signal YW previously allocated to the corresponding write column select line CSLW, outputs an 'H' level (VDD) signal to level shifter 55. Level shifter 55 driven by power supply voltage VDDS for the array, in response to the input of the 'H' level (VDD) signal from column decoder unit circuit 54, outputs a signal of an 'H' level (VDDS) to CSL driver 56. CSL driver 56 driven by power supply voltage VDDS for the array, in response to the input of the 'H' level (VDDS) signal from level shifter 55, turns the corresponding write column select line CSLW to a select level, that is, an 'H' level (VDDS).

Column decoder unit circuit 57 driven by power supply voltage VDD for the peripheral circuitry is provided corresponding to each read column select line CSLR and is activated in response to the change of the state of read column decoder enable signal CDER to an 'H' level (VDD). Column decoder unit circuit 57, in response to the input of read column predecode address signal YR which is previously designated to the corresponding read column select line CSLR, outputs an 'H' level (VDD) signal to CSL driver 58. CSL driver 58 which is driven by power supply voltage VDD for the peripheral circuitry, in response to the input of the 'H' level (VDD) signal from column decoder unit circuit 57, turns corresponding read column select line CSLR to a select level, that is, an 'H' level (VDD).

Figure 7:
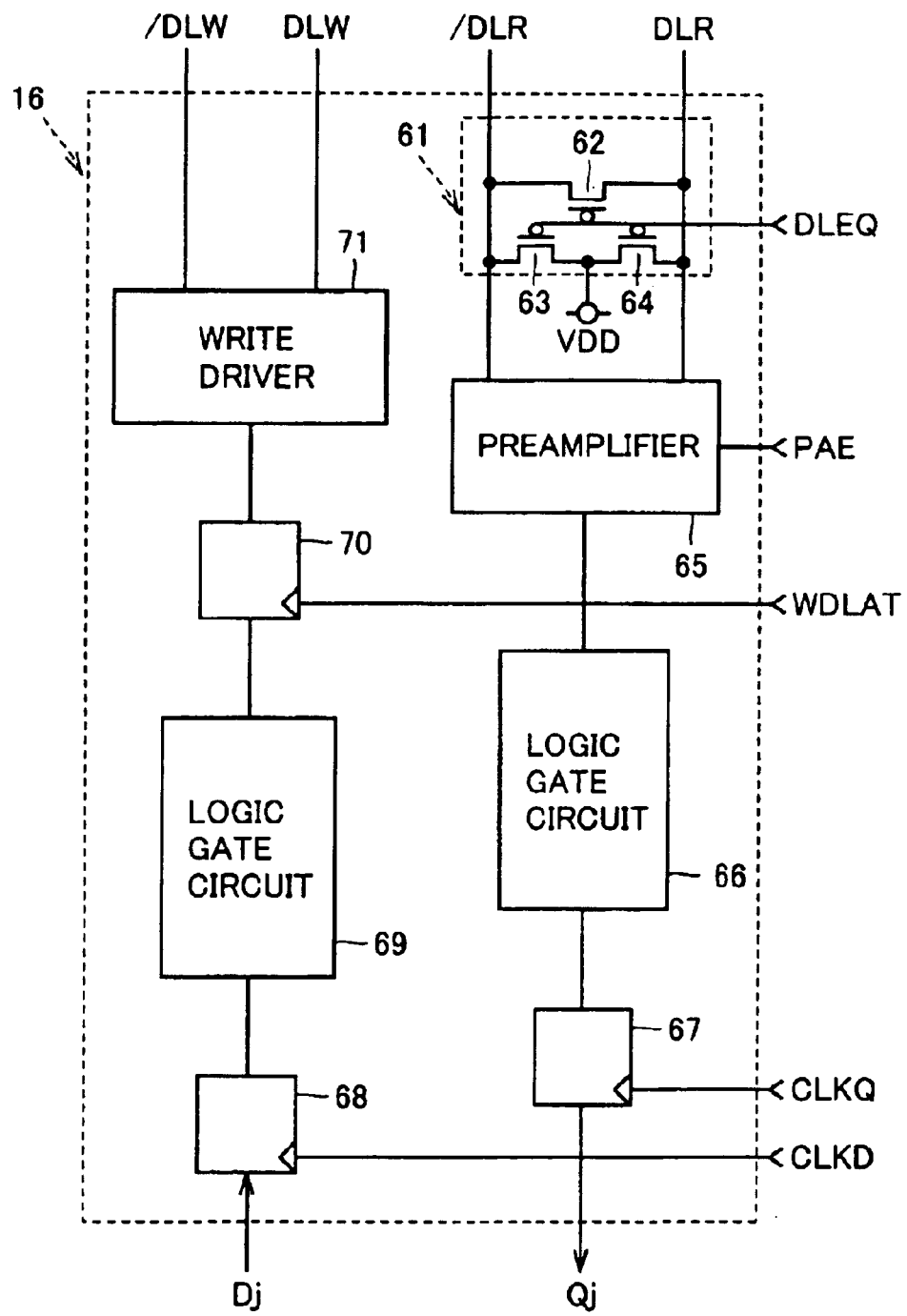
FIG. 7 is a block diagram showing a configuration of a data path band unit circuit 16 shown in FIG. 2.

Returning to FIG. 2, in data path band 14, data path band unit circuit 16 is arranged corresponding to each data line pair DLWP and DLRP. Data path band unit circuit 16 includes, as shown in FIG. 7, an equalizer 61, a preamplifier 65, logic gate circuits 66 and 69, flip flop circuits 67, 68 and 70, and a write driver 71. Data path band unit circuit 16 is driven by power supply voltage VDD for the peripheral circuitry.

Equalizer 61 includes P channel MOS transistors 62~64. P channel MOS transistor 62 is connected between read data line pair /DLR and DLR whereas P channel MOS transistors 63 and 64 are connected in series between read data line pair /DLR and DLR. The gates of P channel MOS transistors 62~64 receive data line equalize signal DLEQ. A node between P channel MOS transistors 63 and 64 receives power supply potential VDD for the peripheral circuitry. When data line equalize signal DLEQ is turned to an 'L' level, P channel MOS transistors 62~64 become conductive, to equalize the potential of read data line pair /DLR and DLR to power supply potential VDD for the peripheral circuitry, and when data line equalize signal DLEQ is turned to an 'H' level, P channel MOS transistors 62~64 are rendered nonconductive, to stop the equalization of read data line pair /DLR and DLR.

Before the reading operation, data line equalize signal DLEQ is turned to an 'L' level and the potential of read data line pair /DLR and DLR are equalized to power supply potential VDD for the peripheral circuitry.

In the reading operation, data line equalize signal DLEQ is turned to an 'H' level to stop the equalization. Data signal read out from read column select gate 23 is supplied to read data line pair /DLR and DLR as a potential difference. Preamplifier 65, when preamplifier activation signal PAE is input, compares the potential difference between read data line pair /DLR and DLR to output read data signal Qj corresponding to the result of comparison to flip flop circuit 67 via logic gate circuit 66 performing a function such as redundancy replacement. Flip flop circuit 67, in synchronization with read clock signal CLKQ, externally supplies read data signal Qj. Preamplifier 65 needs to be activated after the generation of a potential difference between read data line pair /DLR and DLR, and the delay control of preamplifier activation signal PAE is performed in clock generation circuit 1.

In the writing operation, externally input write data signal Dj is supplied to flip flop circuit 68. Flip flop circuit 68 operates in synchronization with write clock signal CLKD and supplies write data signal Dj to flip flop circuit 70 via logical gate circuit 69 performing function such as redundancy replacement. Flip flop circuit 70, when write data latch signal WDLAT is input, transmits write data signal Dj to write driver 71. Write data signal Dj supplied to write driver 71 is supplied to write data line pair /DLW and DLW as a potential difference and transmitted to write column select gate 24.

Next, the operation of the DRAM will be described. Here, the operation which is performed when memory array MA1 is selected from memory arrays MA1 and MA2 shown in FIG. 5 will be described. In the reading operation, array select signal BLI2 is first turned to an 'L' level to render N channel MOS transistors 44 and 45 nonconductive and to electrically separate nodes N28 and N29 and bit lines BL, /BL of memory array MA2. Further, bit line equalize signal BLEQ is turned to an 'L' level to render N channel MOS transistors 25~27 of equalizer 21 nonconductive and to stop the equalization of bit line pair BL, /BL. Then, word line WL of the row corresponding to row address signal RA is turned to a select level, that is, an 'H' level (VPP) by row decoder unit circuit 51. In response to this change, the potential of bit line pair BL, /BL changes by a minor amount according to the charge amount of capacitor C of the activated memory cell MC.

Then, sense amplifier activation signals /SAE and SAE are each sequentially turned to an 'L' level and an 'H' level to activate sense amplifier 22. When the potential of bit line BL is higher than the potential of bit line /BL by a minor amount, the resistance of MOS transistors 31 and 34 is lower than the resistance of MOS transistors 32 and 33, to turn the potential of node N28, that is, the potential of bit line BL to an 'H' level (VDDS) and to turn the potential of node N29, that is, the potential of bit line /BL to an 'L' level (GND). On the other hand, when the potential of bit line /BL is higher than the potential of bit line BL by a minor amount, the resistances of MOS transistors 32 and 33 become lower than the resistances of MOS transistors 31 and 34, to turn the potential of node N29, that is, the potential of bit line /BL to an 'H' level (VDDS) and to turn the potential of node N28, that is, the potential of bit line Bl to an 'L' level (GND).

Next, read column decoder enable signal CDER, which is a one-shot pulse signal, and read column predecode address signal YR which is held for one cycle are supplied to column decoder unit circuit 57 to select one read column select line CSLR. Selected column select line CSLR is turned to a select level, that is, an 'H' level (VDD), to render N channel MOS transistors 38 and 39 of read column select gate 23 of the column conductive. Data signal of bit line pair BL, /BL of the selected column is supplied to data path band unit circuit 16 via read column select gate 23 and read data line pair /DLR and DLR. For example, when bit line BL of the column selected by read column select line CSLR is at an 'H' level (VDDS) and bit line /BL is at an 'L' level (GND), the charge is drawn out from read data line /DLR to gradually lower the potential whereas charge is not drawn out from read data line DLR and the precharged potential is maintained. Preamplifier 65, when preamplifier activation signal PAE is input, outputs read data signal Qj corresponding to the potential difference between read data line pair /DLR and DLR to flip flop circuit 67 via logic gate circuit 66. Flip flop circuit 67 externally supplies read data signal Qj in synchronization with read clock signal CLKQ.

Nodes N28 and N29, in other words, bit line pair BL and /BL connected to read column select gate 23 are driven by power supply voltage VDDS for the array, and read column select line CSLR is driven by power supply voltage VDD for the peripheral circuitry. Hence, even when power supply voltage VDDS for the array decreases and power supply voltage VDD for the peripheral circuitry increases, the speed that charge is drawn from read data line /DLR or DLR at read column select gate 23 does not become very low as read column select line CSLR is driven by power supply voltage VDD for the peripheral circuitry. Hence, even when the delay amount of preamplifier activation signal PAE is small, there is little possibility of malfunction that preamplifier 65 is activated when the potential difference between read data line pair /DLR and DLR is still small, whereby a sufficient timing margin can be secured.

In the writing operation, similarly to the reading operation, initially, array select signal BLI2 is turned to an 'L' level to electrically separate nodes N28 and N29 from bit lines BL, /BL of memory array MA2. Further, the equalization of bit line pair BL, /BL is stopped and word line WL is turned to a select level, that is an 'H' level (VPP). In response to this change, the potential of bit line pair BL, /BL changes by a minor amount corresponding to the charge amount of capacitor C of the activated memory cell MC. Then, sense amplifier 22 is activated to amplify the minor potential difference AV between bit line pair BL, /BL to power supply voltage VDDS for the array.

Next, write data signal Dj is input into flip flop circuit 68 included in data path band unit circuit 16. Flip flop circuit 68 operates in synchronization with write clock signal CLKD and supplies write data signal Dj to flip flop circuit 70 via logic gate circuit 69. Flip flop circuit 70, when a write data latch signal WDLAT is input, provides write data signal Dj to write driver 71. Write data signal Dj supplied to write driver 71 is supplied to write data line pair /DLW, DLW as a potential difference and transmitted to write column select gate 24. Then, write column decoder enable signal CDEW which is a one-shot pulse signal and write column predecode address signal YW which is held for one cycle are input to column decoder unit circuit 54 and one write column select line CSLW is selected. Selected write column select line CSLW is turned to an activation level, that is, an 'H' level (VDDS) to render N channel MOS transistors 40 and 41 of write column select gate 24 of the column conductive.

Write data is supplied as a potential difference between bit line pair BL, /BL via write data line pair /DLW, DLW and write column select gate 24. Data inverse to data held in sense amplifier 22 can be written, as the drivability of write column select gate 24 exceeds the drivability of P channel MOS transistors 31 and 32 of sense amplifier 22 so as to cause data inversion and data storage in memory cell MC.

Here, write column select line CSLW connected to write column select gate 24 is driven by power supply voltage VDDS for the array and write data line pair /DLW, DLW is driven by power supply voltage VDD for the peripheral circuitry. Hence, even when power supply voltage VDDS for the array increases and power supply voltage VDD for the peripheral circuitry decreases, as write column select line CSLW is driven by power supply voltage VDDS for the array, it is unlikely that the drivability of write column select gate 24 does not exceed the drivability of P channel MOS transistors 31 and 32 of sense amplifier 22, whereby the operation margin is sufficiently secured.

In the conventional DRAM, column select lines CSLR and CSLW are driven by the same power supply voltage. For example, when column select lines CSLR and CSLW are both driven by the power supply voltage VDDS for the array, nodes N28 and N29 connected to read column select gate 23, in other words, bit line pair BL, /BL, and read column select line CSLR are both driven by power supply voltage VDDS for the array. Hence, when power supply voltage VDDS for the array decreases and power supply voltage VDD for the peripheral circuitry increases, the speed of charge is drawn from read data line /DLR or DLR becomes low, and at the same time, as the delay amount of preamplifier activation signal PAE generated from power supply voltage VDD for the peripheral circuitry is small, malfunction could happen such that preamplifier 65 is activated when the potential difference between read data line pair /DLR and DLR is still small, whereby the timing margin is not sufficient. When the delay amount of preamplifier activation signal PAE is increased to solve this problem, operation frequency becomes low.

In addition, when column select lines CSLR and CSLW are both driven by power supply voltage VDD for the peripheral circuitry, write column select line CSLW and write data line pair /DLW, DLW connected to write column select gate 24 are both driven by power supply voltage VDD for the peripheral circuitry. Hence, when power supply voltage VDDS for the array becomes high and power supply voltage VDD for the peripheral circuitry becomes low, the drivability of write column select gate 24 cannot exceed the drivability of P channel MOS transistors 31 and 32 of sense amplifier 22 and the data inversion cannot be caused, thus the operation margin is not sufficient.

Thus, in the conventional DRAM, where column select lines CSLR and CSLW are driven by one power supply voltage, either power supply voltage VDDS for the array or power supply voltage VDD for the peripheral circuitry, when one power supply voltage becomes low and other power supply voltage becomes high at the same time, timing margin and operation margin become extremely small.

However, in the first embodiment, nodes N28 and N29 connected to read column select gate 23, in other words, bit line pair BL, /BL, and write column select line CSLW connected to write column select gate 24 are driven by power supply voltage VDDS for the array and read column select line CSLR connected to read column select gate 23 and write data line pair /DLW, DLW connected to write column select gate 24 are driven by power supply voltage VDD for the peripheral circuitry, whereby even when one power supply voltage becomes high and another power supply voltage becomes low at the same time, the timing margin and operation margin can be prevented from becoming extremely small. Thus, a semiconductor memory device allowing a stable high-speed operation with a large timing margin and operation margin can be realized.

[Second Embodiment]

Figure 8:
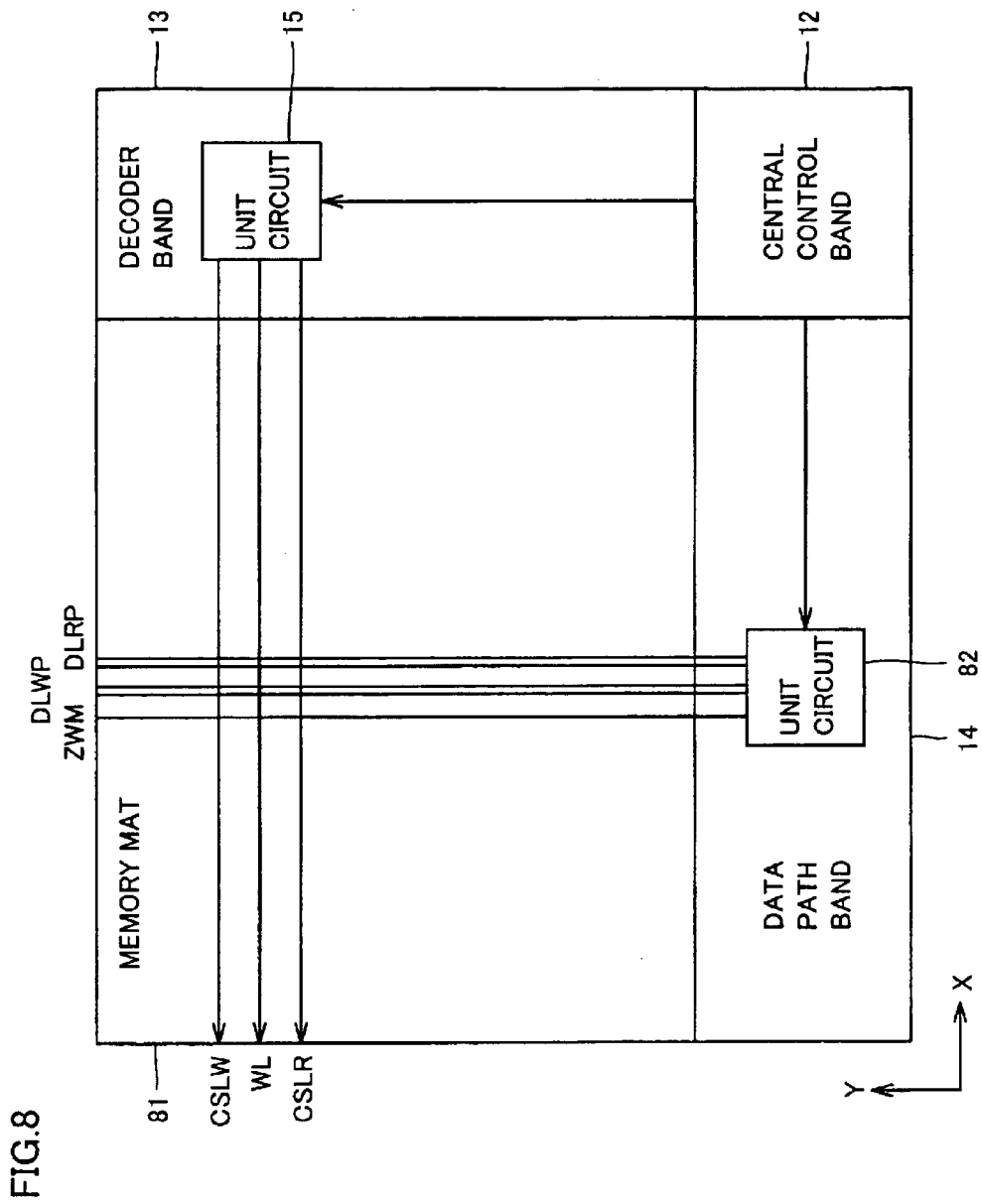
FIG. 8 is a diagram showing a layout of a DRAM according to a second embodiment of the present invention.

FIG. 8 is a layout of the DRAM according to the second embodiment of the present invention and can be compared with FIG. 2. With reference to FIG. 8, DRAM of FIG. 8 is different from DRAM in FIG. 2 in that memory mat 11 and data path band unit circuit 16 are replaced with memory mat 81 and data path band unit circuit 82, and further, a write mask line ZWM is provided which extends in a Y-axis direction from data path band unit circuit 82 in the drawing. Write mask line ZWM is a signal line to control prohibition of data overwriting.

Figure 9:
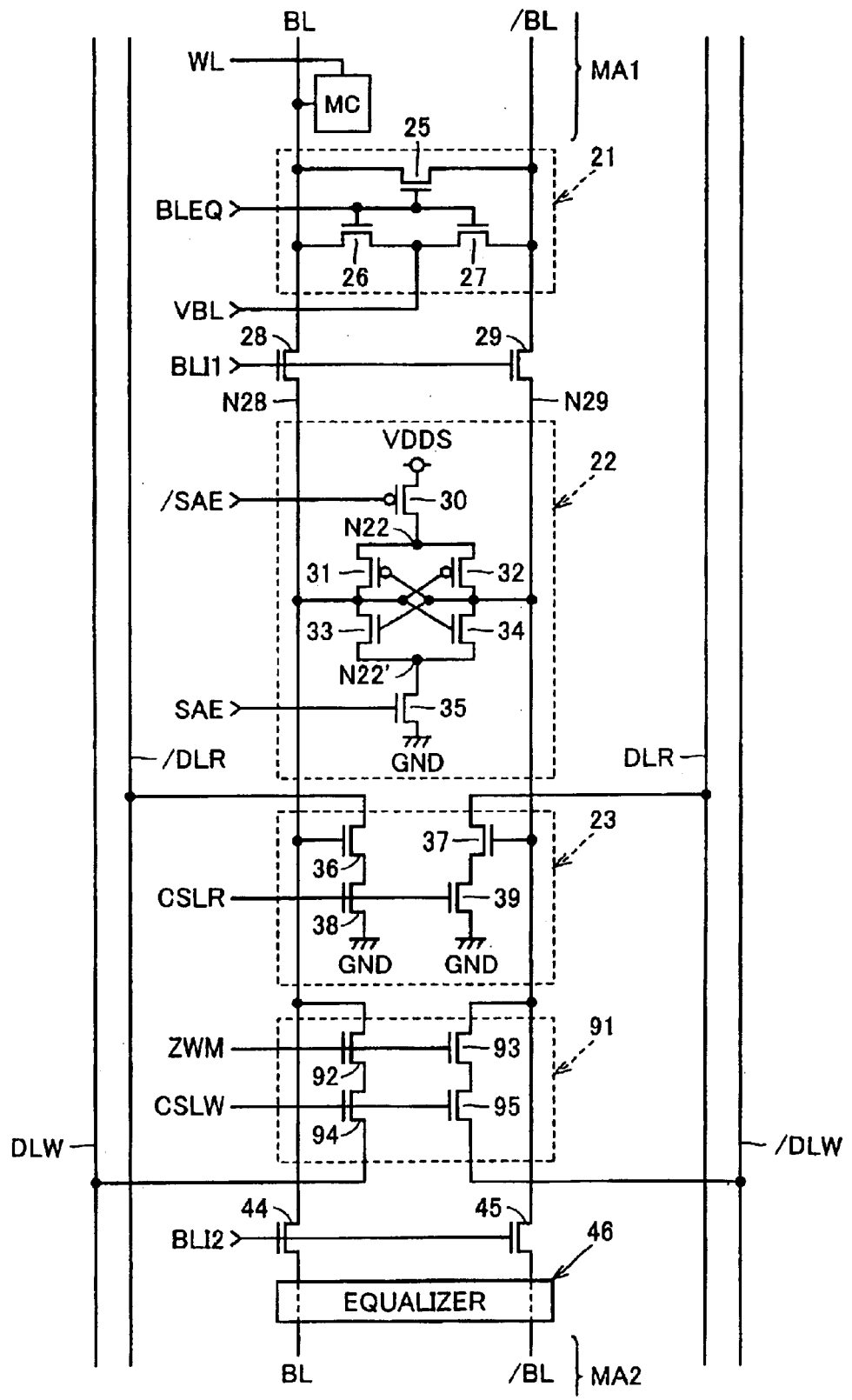
FIG. 9 is a circuit diagram showing in detail a configuration of one column of a sense amplifier band SA2 provided in a memory mat 81 shown in FIG. 8.

FIG. 9 is a circuit diagram showing in detail a configuration of one column of sense amplifier band SA2 provided in memory mat 81 shown in FIG. 8 and can be compared with FIG. 5. With reference to FIG. 9, the configuration of one column of sense amplifier band SA2 is different from the configuration of one column of sense amplifier band SA2 of FIG. 5 in that write column select gate 24 is replaced with write column select gate 91.

Bit line pair BL, /BL and write column select line CSLW are driven by power supply voltage VDDS for the array, whereas read column select line CSLR, write mask line ZWM, read data line pair /DLR, DLR, and write data line pair DLW, /DLW are driven by power supply voltage VDD for the peripheral circuitry.

Write column select gate 91 includes N channel MOS transistors 92 and 94 connected in series between node N28 and write data line DLW and N channel MOS transistors 93 and 95 connected in series between node N29 and write data line /DLW. The gates of N channel MOS transistors 92 and 93 are both connected to write mask line ZWM and the gates of N channel MOS transistors 94 and 95 are both connected to write column select line CSLW. When write mask line ZWM is at an 'H' level (VDD), if write column select line CSLW is turned to a select level, that is, an 'H' level (VDDS), by decoder band unit circuit 15, N channel MOS transistors 92~95 become conductive and nodes N28 and N29, that is, bit line BL, /BL and write data line DLW and /DLW are coupled, respectively, to perform the writing operation. When write mask line ZWM is at an 'L' level, N channel MOS transistors 92 and 93 of write column select gate 91 become nonconductive to electrically separate nodes N28 and N29, that is, bit lines BL, /BL from write data lines DLW and /DLW, respectively, thereby prohibiting the data overwriting.

Figure 10:
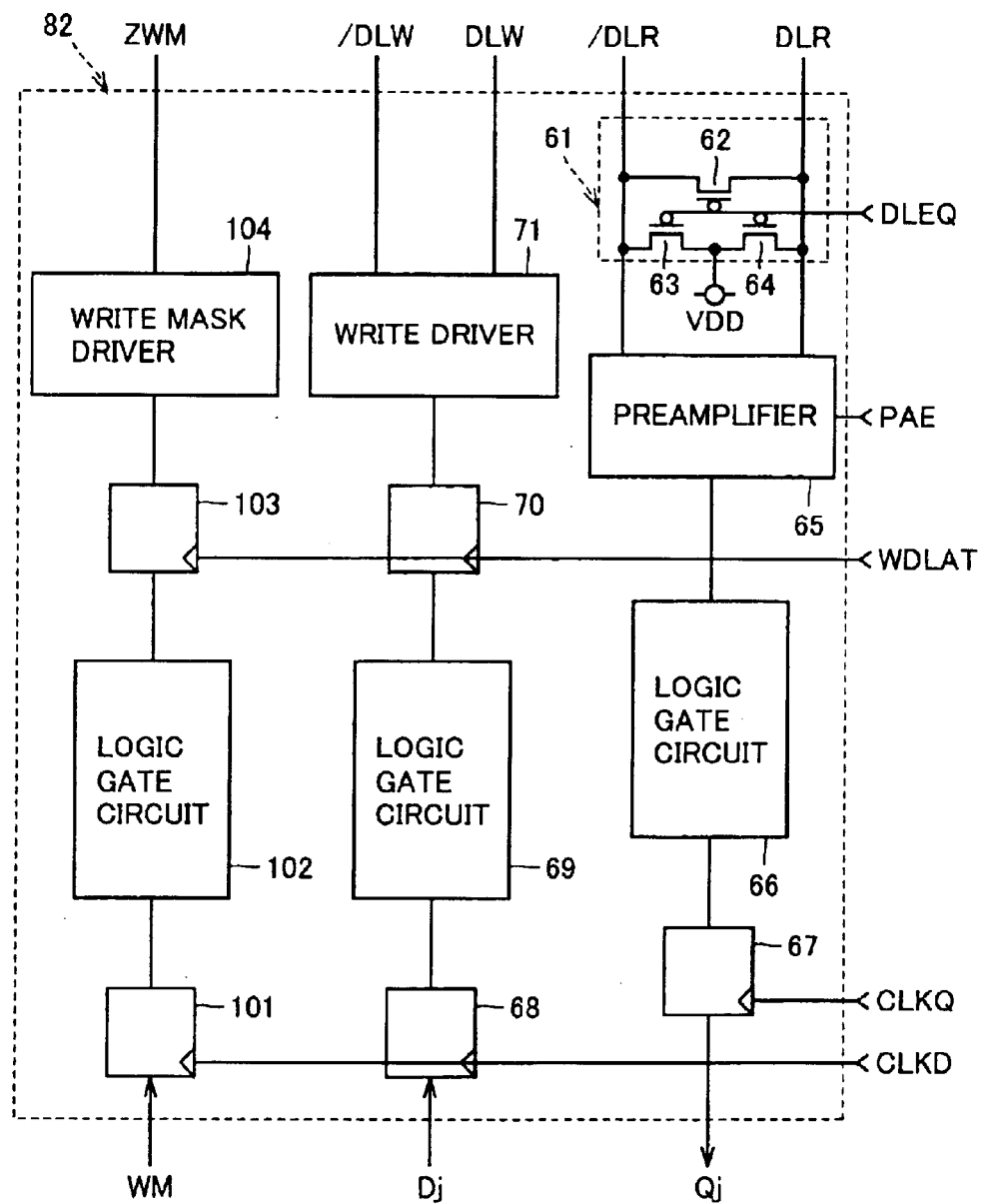
FIG. 10 is a block diagram showing a configuration of a data path band unit circuit 82 shown in FIG. 8.

Returning to FIG. 8, in data path band 14, data path band unit circuit 82 is arranged corresponding to each data line pair DLWP, DLRP and write mask line ZWM. FIG. 10 is a block diagram showing a configuration of data path band unit circuit 82 and compared with FIG. 7. With reference to FIG. 10, data path band unit circuit 82 is different from data path band unit circuit 16 of FIG. 7 in that the circuit of FIG. 10 includes flip flop circuits 101 and 103, a logic gate circuit 102, and a write mask driver 104.

Write mask signal WM externally supplied is supplied to flip flop circuit 101. Flip flop circuit 101 operates in synchronization with write clock signal CLKD and supplies write mask signal WM to flip flop circuit 103 via logic gate circuit 102 performing a function such as redundancy replacement. Flip flop circuit 103, when write data latch signal WDLAT is input, sends write mask signal WM to write mask driver 104. Write mask driver 104, in response to supplied write mask signal WM, turns write mask line ZWM to an 'L' level or an 'H' level (VDD).

Here, write column select line CSLW connected to write column select gate 91 is driven by power supply voltage VDDS for the array and write mask line ZWM is driven by power supply voltage VDD for the peripheral circuitry. Hence, even when power supply voltage VDDS for the array becomes high and power supply voltage VDD for the peripheral circuitry becomes low, as write column select line CSLW is driven by power supply voltage VDDS for the array, it is unlikely that the drivability of write column select gate 91 cannot exceed the drivability of P channel MOS transistors 31 and 32 of sense amplifier 22, whereby operation margin is sufficiently secured.

Hence in this second embodiment, nodes N28 and N29 connected to read column select gate 23, in other words, bit line pair BL, /BL and write column select line CSLW connected to write column select gate 91 are driven by power supply voltage VDDS for the array, whereas read column select line CSLR connected to read column select gate 23 and write mask line ZWM connected to write column select gate 91 are driven by power supply voltage VDD for the peripheral circuitry. Hence, even when one power supply voltage becomes low and another power supply voltage becomes high, the timing margin and operation margin is prevented from becoming extremely small. Thus, a semiconductor memory device allowing a stable high-speed operation with a large timing margin and operation margin can be realized.

[Third Embodiment]

Figure 11:
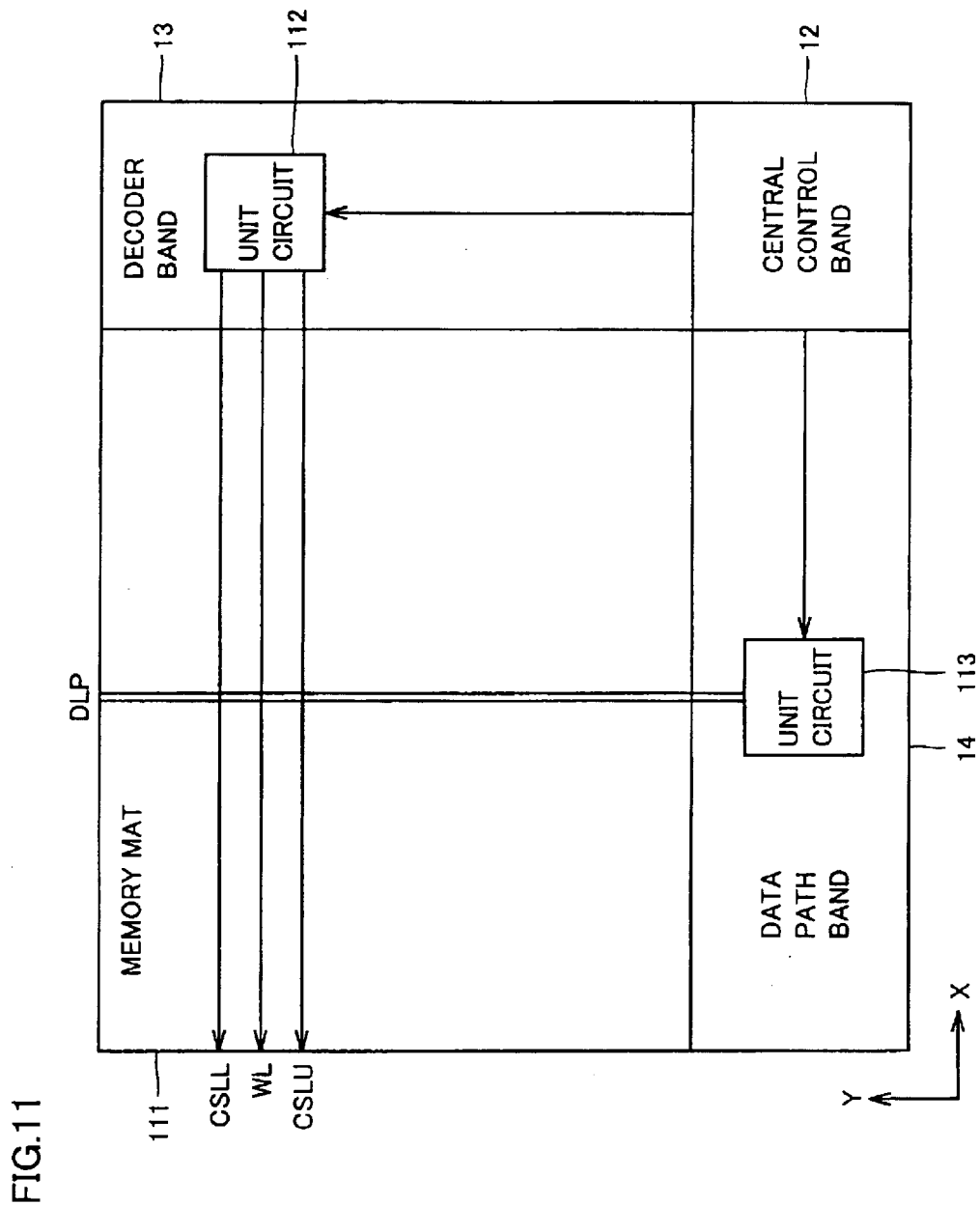
FIG. 11 is a diagram showing a layout of a DRAM according to a third embodiment of the present invention.

FIG. 11 is a layout of DRAM according to the third embodiment of the present invention and is compared with FIG. 2. With reference to FIG. 11, DRAM of FIG. 11 is different from DRAM of FIG. 2 in that column select lines CSLW and CSLR are replaced with column select lines CSLL and CSLU, and data line pair DLWP and DLRP are replaced with data line pair DLP, memory mat 11, decoder band unit circuit 15 and data path band unit circuit 16 are replaced with memory mat 111, decoder band unit circuit 112 and data path band unit circuit 1113. Here, the writing operation and the reading operation are performed with the same data line pair DLP.

Figure 12:
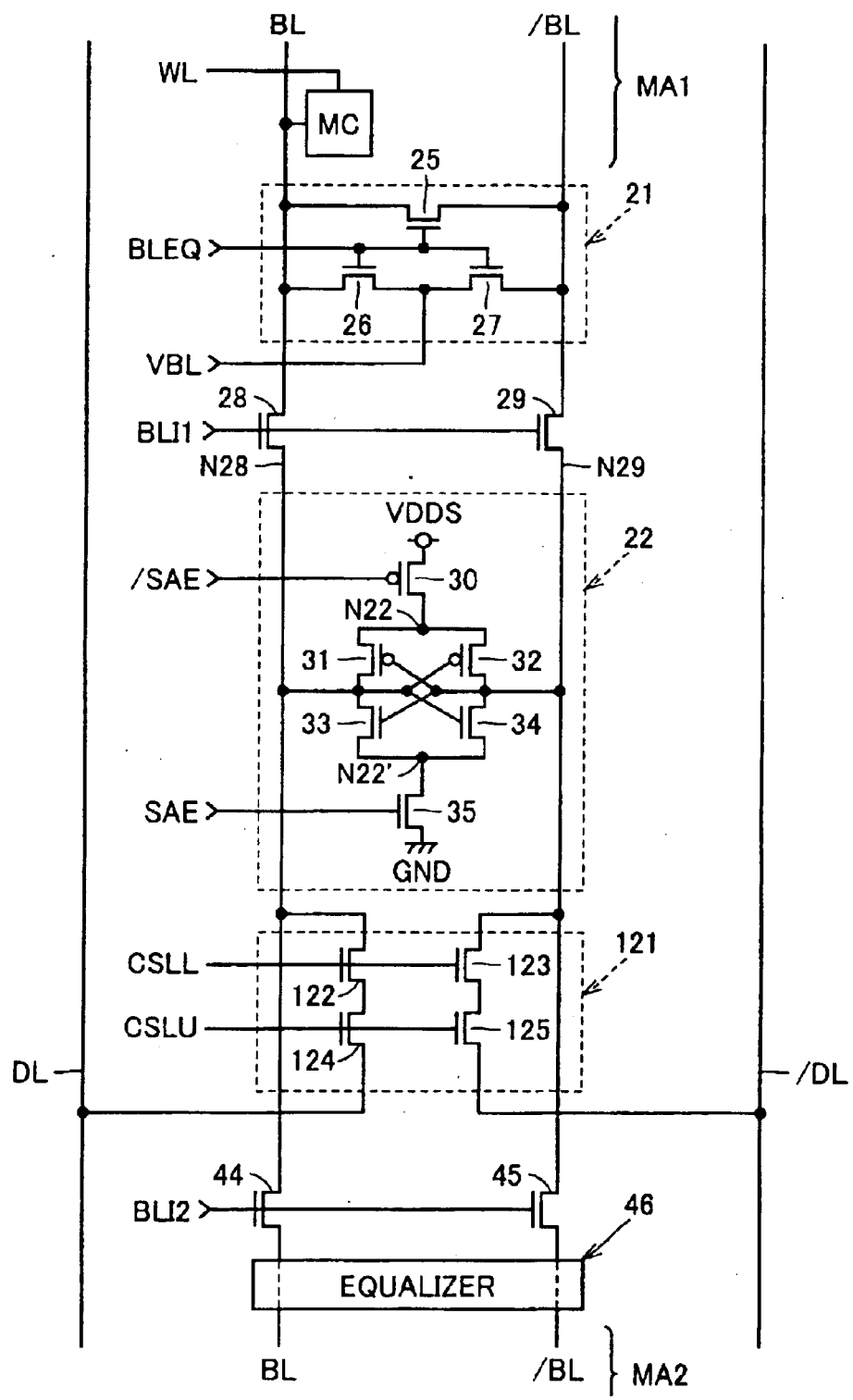
FIG. 12 is a circuit diagram showing in detail a configuration of one column of a sense amplifier band SA2 provided in a memory mat 111 shown in FIG. 11.

FIG. 12 is a circuit diagram showing in detail a configuration of one column of sense amplifier band SA2 provided in memory mat 111 shown in FIG. 11 and is compared with FIG. 5. With reference to FIG. 12, the configuration of one column of sense amplifier band SA2 is different from the configuration of one column of sense amplifier band SA2 of FIG. 5 in that read column select gate 23 and write column select gate 24 are replaced with column select gate 121.

Bit line pair BL, /BL and column select line CSLL are driven by power supply voltage VDDS for the array and column select line CSLU and data line pair DL, /DL are driven by power supply voltage VDD for the peripheral circuitry.

Column select gate 121 includes N channel MOS transistors 122 and 124 connected in series between node N28 and data line DL, and N channel MOS transistors 123 and 125 connected in series between node N29 and data line /DL. The gates of N channel MOS transistors 122 and 123 are connected to column select line CSLL, and the gates of N channel MOS transistors 124 and 125 are connected to column select line CSLU.

When column select lines CSLL and CSLU are turned to a select level, that is, an 'H' level (VDDS, VDD) by decoder band unit circuit 112, respectively, N channel MOS transistors 122~125 are rendered conductive and nodes N28 and N29, in other words, bit lines BL, /BL and data lines DL, /DL are coupled, respectively, and the reading operation and the writing operation are performed.

Figure 13:
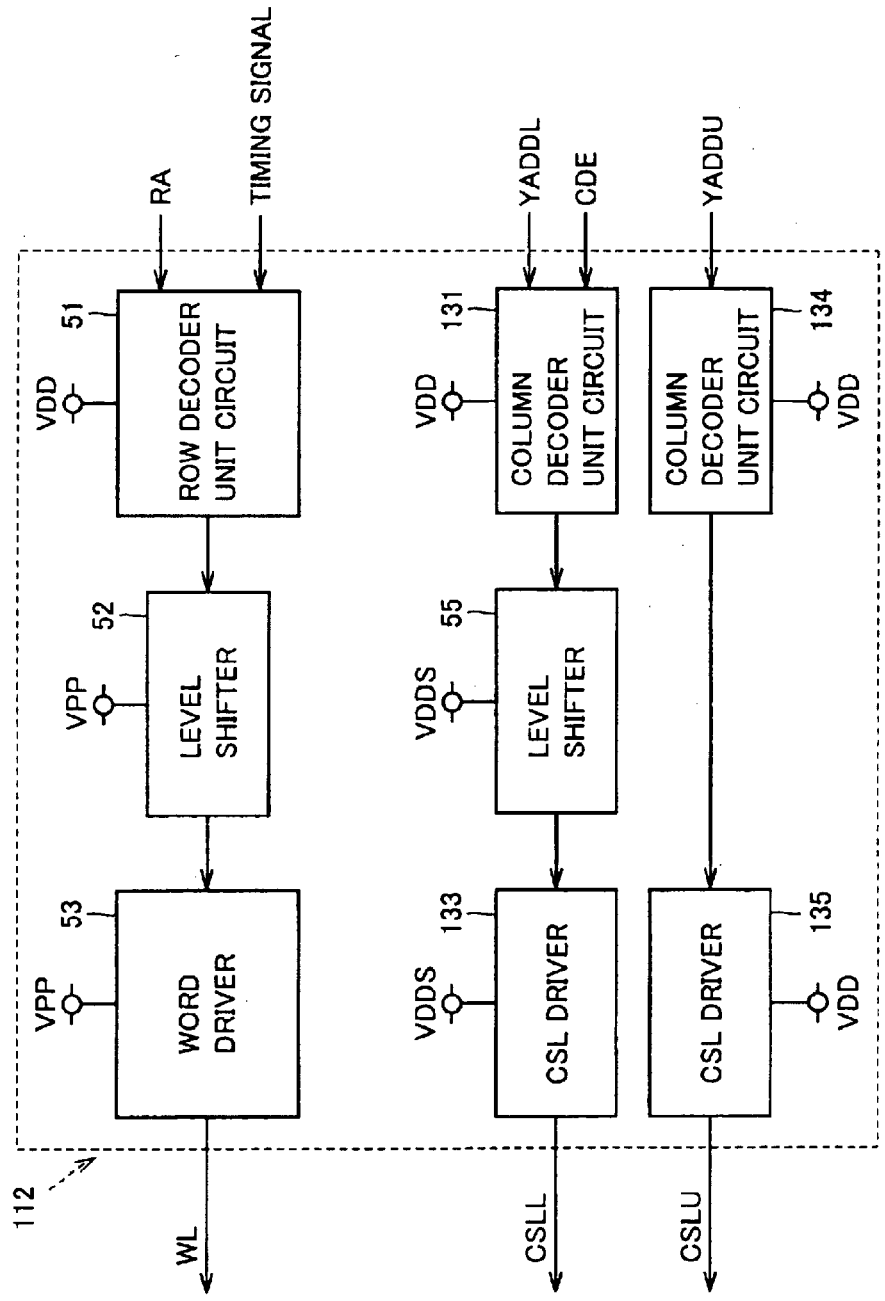
FIG. 13 is a block diagram showing a configuration of a decoder band unit circuit 112 shown in FIG. 11.

Returning to FIG. 11, in decoder band 13, decoder band unit circuit 112 is arranged corresponding to each word line WL and column select lines CSLL and CSLU. FIG. 13 is a block diagram showing a configuration of decoder band unit circuit 112 and is compared with FIG. 6. With reference to FIG. 13, decoder band unit circuit 112 is different from decoder band unit circuit 15 in that column decoder unit circuits 54 and 57 are replaced with column decoder unit circuits 131 and 134, CSL drivers 56 and 58 are replaced with CSL drivers 133 and 135, write column predecode address signal YW and write column decoder enable signal CDEW supplied to column decoder unit circuit 54 are replaced with predecode address signal YADDL and column decoder enable signal CDE supplied to column decoder unit circuit 131, read column predecode address signal YR and read column decoder enable signal CDER supplied to column decoder unit circuit 57 are replaced with predecode address signal YADDU, write column select line CSLW from CSL driver 56 is replaced with column select line CSLL from CSL driver 133, and read column select line CSLR from CSL driver 58 is replaced with column select line CSLU from CSL driver 135.

Column decoder enable signal CDE is output from clock generation circuit 1 arranged in central control band 12 whereas predecode address signals YADDL and YADDU are output from row and column address buffer 2 arranged in central control band 12.

Column decoder unit circuit 131 driven by power supply voltage VDD for the peripheral circuitry is provided corresponding to each column select line CSLL and is activated according to the change of the state of column decoder enable signal CDE to an 'H' level (VDD). Column decoder unit circuit 131, in response to the input of column predecode address signal YADDL previously allocated to the corresponding column select line CSLL, outputs an 'H' level (VDD) signal to level shifter 55. Level shifter 55 driven by power supply voltage VDDS for the array, in response to the input of the 'H' level (VDD) signal from column decoder unit circuit 131, outputs an 'H' level (VDDS) signal to CSL driver 133. CSL driver 133 driven by power supply voltage VDDS for the array, in response to the input of the 'H' level (VDDS) signal from level shifter 55, turns the corresponding column select line CSLL to a select level, that is, an 'H' level (VDDS).

Column decoder unit circuit 134 driven by power supply voltage VDD for the peripheral circuitry is provided corresponding to each column select line CSLU and, in response to the input of column predecode address signal YADDU previously allocated to the corresponding column select line CSLU, outputs an 'H' level (VDD) signal to CSL driver 135. CSL driver 135 driven by power supply voltage VDD for the peripheral circuitry, in response to the input of the 'H' level (VDD) signal from column decoder unit circuit 134, turns the corresponding column select line CSLU to a select level, that is, an 'H' level (VDD).

Figure 14:
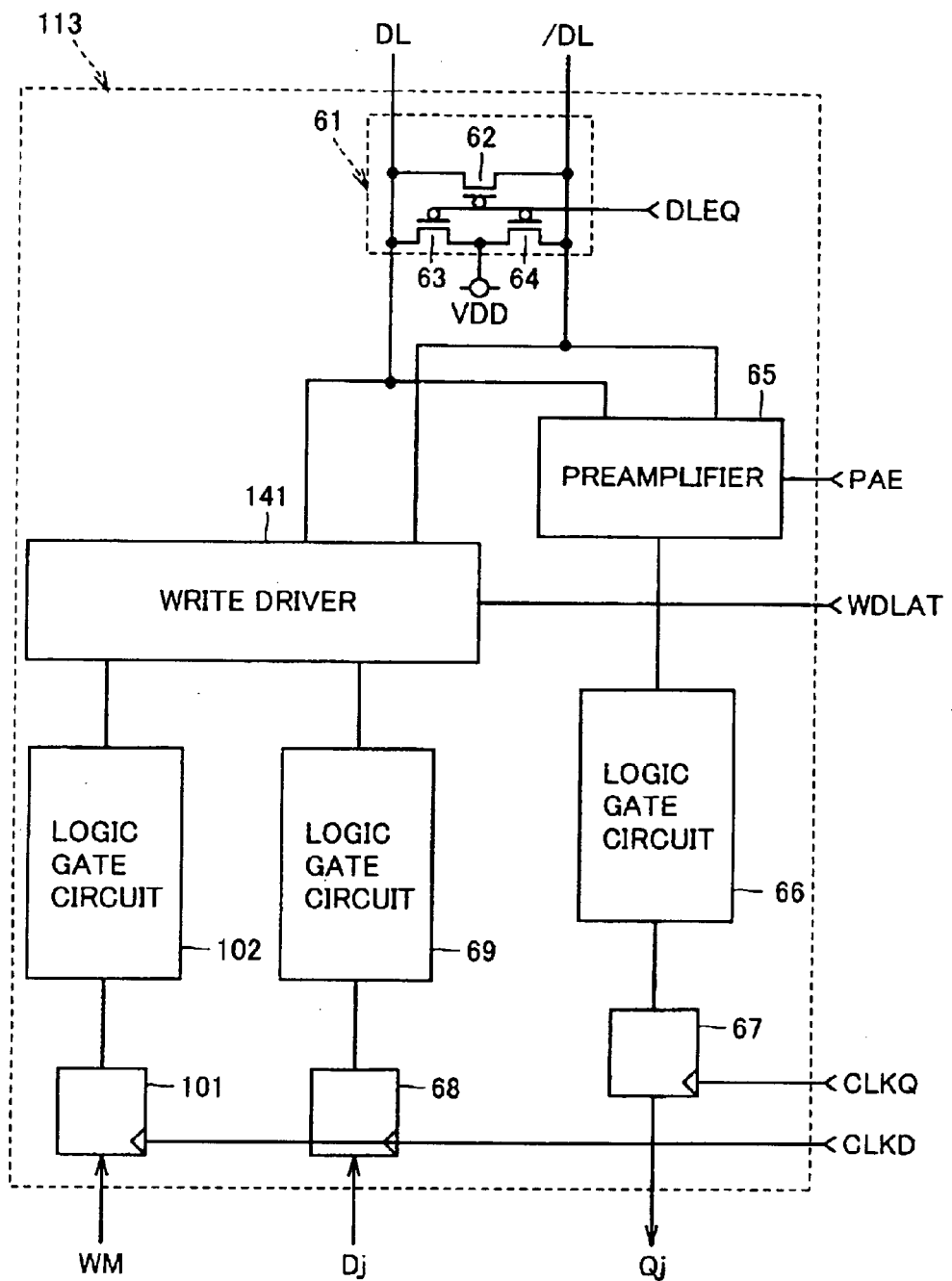
FIG. 14 is a block diagram showing a configuration of a data path band unit circuit 113 shown in FIG. 11.

Returning to FIG. 11, data path band unit circuit 113 is arranged in data path band 14 corresponding to each data line pair DLP. FIG. 14 is a block diagram showing a configuration of data path band unit circuit 113 and is compared with FIG. 10. With reference to FIG. 14, data path band unit circuit 113 is different from data path band unit circuit 82 of FIG. 10 in that read data line /DLR and write data line /DLW are replaced with data line DL, read data line DLR and write data line DLW are replaced with data line /DL, flip flop circuits 70 and 103 are eliminated, and write driver 71 and write mask driver 104 are replaced with write driver 141 controlled by write driver latch signal WDLAT.

Write driver 141, when write driver latch signal WDLAT is input from clock generation circuit 1, supplies write data signal Dj to data line pair DL, /DL as a potential difference, and transmits write data signal Dj to column select gate 121. Further, write driver 141, when write mask signal WM is input, turns data line pair DL, /DL both to an 'H' level. Thus, data overwriting is prohibited.

Next, the operation of DRAM will be described. In the reading operation, equalizer 21, memory cell MC and sense amplifier 22 operate as described in connection with the first embodiment. Then, column decoder enable signal CDE which is a one-shot pulse signal and column predecode address signal YADDL which is held for one cycle are supplied to column decoder unit circuit 131 and one column select line CSLL is selected. Further, column predecode address signal YADDU which is held for one cycle is input to column decoder unit circuit 134 and one column select line CSLU is selected. Selected column select lines CSLL and CSLU are turned to their respective select levels, 'H' levels (VDDS, VDD) to render N channel MOS transistors 122~125 of column select gate 121 of the column conductive. Data signal of bit line pair BL, /BL of the selected column is supplied to data path band unit circuit 113 via column select gate 121 and data line pair DL, /DL. For example, when bit lines BL, /BL of the column selected by column select lines CSLL and CSLU are at an 'H' level (VDDS) and an 'L' level (GND), respectively, the potential of data line /DL decreases whereas the precharged potential of data line DL is maintained. Preamplifier 65, when supplied with preamplifier activation signal PAE, outputs read data signal Qj corresponding to the potential difference between data line pair DL, /DL via logic gate 66 to flip flop circuit 67. Flip flop circuit 67, in synchronization with read clock signal CLKQ, externally supplies read data signal Qj.

Here, column select line CSLL is driven by power supply voltage VDDS for the array, whereas column select line CSLU is driven by power supply voltage VDD for the peripheral circuitry. Hence, even when power supply voltage VDDS for the array becomes low and power supply voltage VDD for the peripheral circuitry becomes high, the speed that charge is drawn from data line /DL or DL at column select gate 121 does not slow down much as column select line CSLU is driven by power supply voltage VDD for the peripheral circuitry. Hence, even when the delay amount of preamplifier activation signal PAE is small, it is unlikely that malfunction occurs such that preamplifier 65 is activated when the potential difference between data line pair DL, /DL is still small, whereby the timing margin is sufficiently secured.

In the writing operation, equalizer 21, memory cell MC and sense amplifier 22 operate in the same manner as described in connection with the first embodiment. Then, write data signal Dj is input to flip flop circuit 68 included in data path band unit circuit 113. Flip flop circuit 68 operates in synchronization with write clock signal CLKD and outputs write data signal Dj to write driver 141 via logic gate circuit 69. Write data signal Dj input to write driver 141, when write driver latch signal WDLAT is input to write driver 141, is supplied to data line pair DL, /DL as a potential difference and transmitted to column select gate 121. Then, column decoder enable signal CDE, which is a one-shot pulse signal, and column predecode address signal YADDL, which is held for one cycle, are input to column decoder unit circuit 131 and column predecode address signal YADDU is input to column decoder unit circuit 134, to select one column select line CSLL, and one column select line CSLU. Selected column select lines CSLL and CSLU are turned to a respective activation level, that is, an 'H' level (VDDS, VDD), to render N channel MOS transistors 122~125 of column select gate 121 of their columns conductive.

Write data is supplied as the potential difference between bit line pair BL, /BL via data line pair DL, /DL and column select gate 121. When data inverse to the data held by sense amplifier 22 is to be written, the drivability of column select gate 121 is made to exceed the drivability of P channel MOS transistors 31 and 32 of sense amplifier 22 to cause data inversion, whereby data is stored in memory cell MC. When write mask signal WM is input into write driver 141, write driver 141 may turn both data lines DL, /DL to an 'H' level to prohibit data overwriting.

Here, column select line CSLL connected to column select gate 121 is driven by power supply voltage VDDS for the array and column select line CSLU is driven by power supply voltage VDD for the peripheral circuitry. Hence, even when power supply voltage VDDS for the array decreases and power supply voltage VDD for the peripheral circuitry increases, to make their relation [power supply potential for the array VDDS]<[power supply potential for the peripheral circuitry VDD−threshold potential Vthn], as column select line CSLL is driven by power supply voltage VDDS for the array, only the potential of [power supply potential for the array VDDS−threshold potential Vthn] is transmitted to bit lines BL, /BL, whereby there is little possibility that data held in sense amplifier 22 is destroyed at the time of overwriting prohibition operation.

Figure 15:
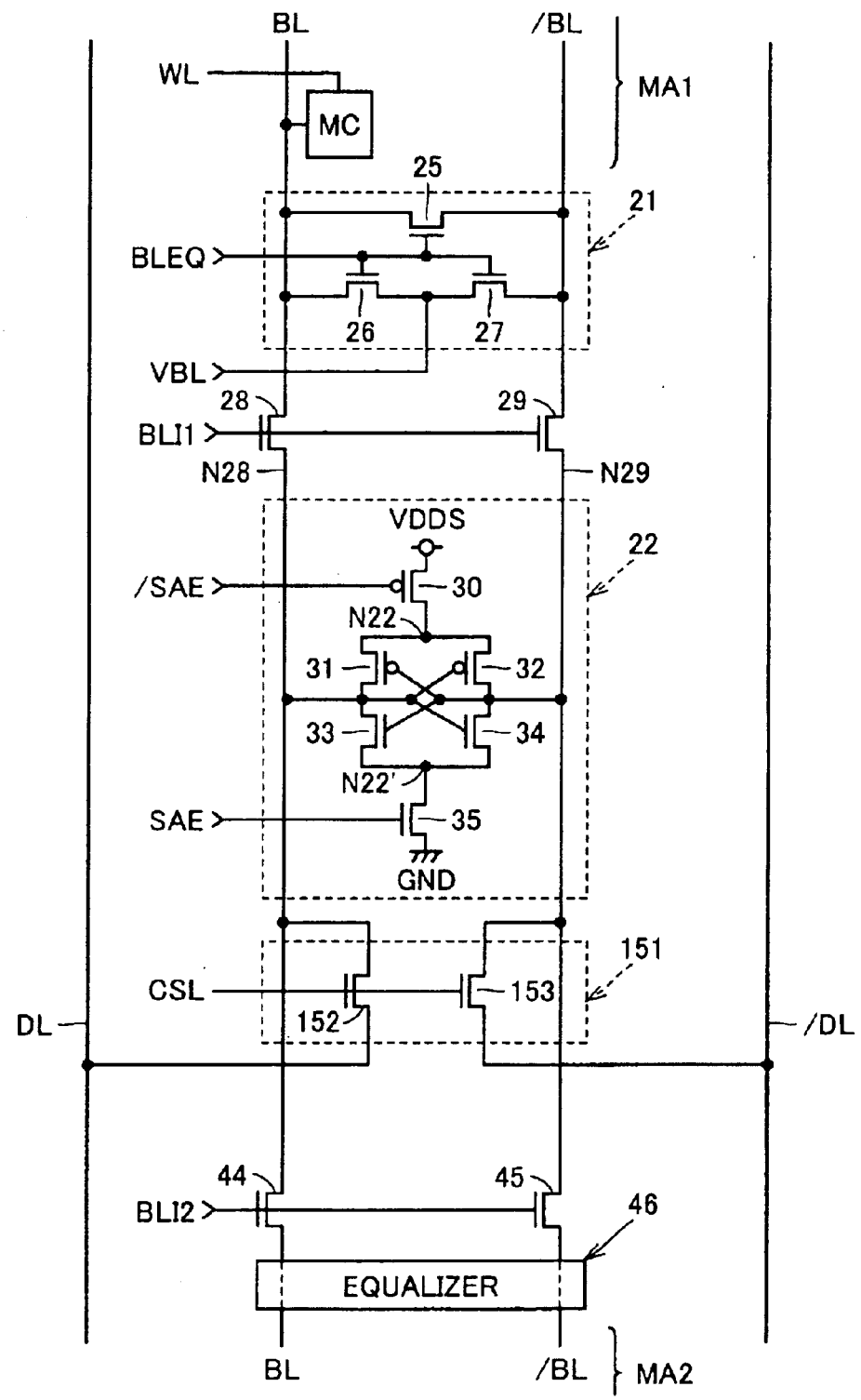
FIG. 15 is a circuit diagram to be compared with the third embodiment.

FIG. 15 is a circuit diagram showing in detail, as a comparison for the third embodiment of the present invention, a configuration of one column of sense amplifier band SA2 of the conventional DRAM and is compared with FIG. 12. With reference to FIG. 15, the configuration of one column of sense amplifier band SA2 of the conventional DRAM is different from the configuration of one column of sense amplifier band SA2 of FIG. 12 in that column select gate 121 is replaced with column select gate 151.

Bit line pair BL, /BL is driven by power supply voltage VDDS for the array and data line pair DL, /DL is driven by power supply voltage VDD for the peripheral circuitry.

Column select gate 151 includes an N channel MOS transistor 152 connected between node N28 and data line DL and an N channel MOS transistor 153 connected between node N29 and data line /DL. The gates of N channel MOS transistors 152 and 153 are both connected to column select line CSL.

When column select line CSL is turned to a select level, that is, an 'H' level, N channel MOS transistors 152 and 153 are rendered conductive to couple nodes N28 and N29, in other words, bit line BL, /BL and data line DL, /DL, respectively, and the writing operation or the reading operation is performed.

When column select line CSL is driven by power supply voltage VDDS for the array, if power supply voltage VDDS for the array decreases and power supply voltage VDD for the peripheral circuitry increases, though the speed that charge is drawn from data line DL or /DL becomes slow at the time of reading operation, the delay amount of preamplifier activation signal PAE generated by power supply voltage VDD for the peripheral circuitry is small and the malfunction sometimes happens such that preamplifier 65 is activated while the potential difference between data line pair DL, /DL is still small, whereby the timing margin is insufficient. However, if the delay amount of preamplifier activation signal PAE is made large to solve this problem, the operating frequency becomes low.

In a memory with a large bus width such as an embedded RAM (eRAM), a write mask function which allows prohibition of overwriting on one byte basis (eight data lines) is necessary and overwriting can be prohibited by turning data line pair DL, /DL to an 'H' level. However, when column select line CSL is driven by power supply voltage VDD for the peripheral circuitry, if power supply voltage VDDS for the array decreases and power supply voltage VDD for the peripheral circuitry increases, making their relation [power supply potential for the array VDDS]<[power supply potential for the peripheral circuitry VDD−threshold potential Vthn], the potential of [power supply potential for the peripheral circuitry VDD−threshold potential Vthn] is transmitted to bit lines BL, /BL. Hence it is possible that data held by sense amplifier 22 is destroyed at the time of overwriting prohibition operation, whereby the operation margin is not sufficient.

Thus, in the conventional DRAM, as the column select line connected to column select gate 151 is formed with one column select line CSL, when one of power supply voltage VDDS for the array and power supply voltage VDD for the peripheral circuitry is low and another power supply voltage is high, timing margin and operation margin become extremely small.

In the third embodiment of the present invention, however, column select line CSLL connected to column select gate 121 is driven by power supply voltage VDDS for the array and column select line CSLU is driven by power supply voltage VDD for the peripheral circuitry. Hence, even when one power supply voltage becomes low and another power supply voltage becomes high, at the same time, timing margin and operation margin can be prevented from becoming extremely small. Thus, a semiconductor memory device allowing a stable high-speed operation with a large timing margin and operation margin can be realized.

The embodiment disclosed herein should be taken as illustration only and not limiting in any manner. The scope of the invention is shown by claims and not by the description of the embodiment and includes all modifications which fall within the scope and meaning equivalent to claims.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device driven by a first power supply potential and a second power supply potential supplied independently from each other and a reference potential, the second power supply potential being different from the first power supply potential, comprising:

a memory array including a plurality of memory cells arranged in a plurality of rows and a plurality of columns, a plurality of word lines provided corresponding to said plurality of rows, respectively, and a plurality of sets of first and second bit lines provided corresponding to said plurality of columns, respectively;

a sense amplifier provided corresponding to each set of the first and the second bit lines to amplify a potential difference generated between corresponding bit lines to a potential difference between said first power supply potential and said reference potential;

a row decoder to select one word line from said plurality of word lines according to a row address signal and to activate each memory cell corresponding to the selected word line;

first and second read data lines provided commonly to said plurality of sets of first and second bit lines and previously charged to said second power supply potential;

first and second write data lines commonly provided for said plurality of sets of first and second bit lines;

a plurality of read column select lines and write column select lines provided corresponding to said plurality of sets of first and second bit lines, respectively;

a read column decoder to select one read column select line from said plurality of read column select lines according to a column address signal and to turn the selected read column select line to said second power supply potential at a reading operation;

a write column decoder to select one write column select line from said plurality of write column select lines according to a column address signal and to turn the selected write column select line to said first power supply potential at a writing operation;

a read column select gate provided corresponding to each set of the first and the second bit lines, in response to an attainment of said second power supply potential by a corresponding read column select line through said read column decoder, to transmit a potential difference of a corresponding set of first and second bit lines to said first and second read data lines;

a read circuit to read a data signal of a memory cell selected by said row decoder and said column decoder based on a potential difference of said first and second read data lines;

a write circuit to turn one write data line of said first and second write data lines to said second power supply potential and to turn another write data line to said reference potential according to an external data signal; and a write column select gate provided corresponding to each set of the first and the second bit lines, in response to an attainment of said first power supply potential by a corresponding write column select line through said write column decoder, to transmit a potential difference of said first and second write data lines to a corresponding set of first and second bit lines; wherein said read column select gate includes first and second transistors, connected in series between said first read data line and a line of said reference potential and a gate electrode of one transistor of said first and second transistors is connected to a corresponding first bit line and a gate electrode of another transistor of said first and second transistors is connected to a corresponding read column select line, and third and fourth transistors, connected in series between said second read data line and the line of said reference potential, a gate electrode of one transistor of said third and fourth transistors is connected to a corresponding second bit line and a gate electrode of another transistor is connected to a corresponding read column select line;

said write column select gate includes fifth and sixth transistors connected in series between a corresponding first bit line and a line of said reference potential, a gate electrode of one transistor of said fifth and sixth transistors is connected to a corresponding write column select line and a gate electrode of another transistor of said fifth and sixth transistors is connected to said first write data line, and seventh and eighth transistors connected in series between a corresponding second bit line and the line of said reference potential, a gate electrode of one transistor of said seventh and eighth transistors is connected to a corresponding write column select line and a gate electrode of another transistor of said seventh and eighth transistors is connected to said second write data line.

2. A semiconductor memory device driven by a first power supply potential and a second power supply potential supplied independently from each other and a reference potential, the second power supply potential being different from the first power supply potential, comprising:

a memory array including a plurality of memory cells arranged in a plurality of rows and a plurality of columns, a plurality of word lines provided corresponding to said plurality of rows, respectively, and a plurality of sets of first and second bit lines provided corresponding to said plurality of columns, respectively;

a sense amplifier provided corresponding to each set of the first and the second bit lines to amplify a potential difference generated between corresponding bit lines to a potential difference between said first power supply potential and said reference potential;

a row decoder to select one word line from said plurality of word lines according to a row address signal and to activate each memory cell corresponding to the selected word line;

first and second read data lines provided commonly to said plurality of sets of first and second bit lines and previously charged to said second power supply potential;

first and second write data lines commonly provided for said plurality of sets of first and second bit lines;

a plurality of read column select lines and write column select lines provided corresponding to said plurality of sets of first an& second bit lines, respectively;

a read column decoder to select one read column select line from said plurality of read column select lines according to a column address signal and to turn the selected read column select line to said second power supply potential at a reading operation;

a write column decoder to select one write column select line from said plurality of write column select lines according to a column address signal and to turn the selected write column select line to said first power supply potential at a writing operation;

a read column select gate provided corresponding to each set of the first and the second bit lines, in response to an attainment of said second power supply potential by the corresponding read column select line through said read column decoder, to transmit a potential difference of the corresponding set of first and second bit lines to said first and second read data lines;

a read circuit to read a data signal of a memory cell selected by said row decoder and said column decoder based on a potential difference of said first and second read data lines;

a write circuit to turn one write data line of said first and second write data lines to said second power supply potential and to turn another write data line to said reference potential according to an external data signal; and a write column select gate provided corresponding to each set of the first and the second bit lines, activated when a write mask signal is at said second power supply potential, in response to an attainment of said first power supply potential by a corresponding write column select line through said write column decoder, to transmit a potential difference between said first and second write data lines to a corresponding set of first and second bit lines; wherein said read column select gate includes first and second transistors, connected in series between said first read data line and a line of said reference potential and a gate electrode of one transistor of said first and second transistors is connected to a corresponding first bit line and a gate electrode of another transistor of said first and second transistors is connected to a corresponding read column select line, and third and fourth transistors, connected in series between said second read data line and the line of said reference potential, a gate electrode of one transistor of said third and fourth transistors is connected to a corresponding second bit line and a gate electrode of another transistor is connected to a corresponding read column select line;

said write column select gate includes fifth and sixth transistors connected in series between a corresponding first bit line and said first write data line, a gate electrode of one transistor of said fifth and sixth transistors receives said write mask signal, and a gate electrode of another transistor of said fifth and sixth transistors is connected to said write column select line, and seventh and eighth transistors connected in series between a corresponding second bit line and said second write data line, a gate electrode of one transistor of said seventh and eighth transistors receives said write mask signal and a gate electrode of another transistor of said seventh and eighth transistors is connected to said write column select line.

3. A semiconductor memory device driven by a first power supply potential and a second power supply potential supplied independently from each other and a reference potential, the second power supply potential being different from the first power supply potential, comprising:

a memory array including a plurality of memory cells arranged in a plurality of rows and a plurality of columns, a plurality of word lines provided corresponding to said plurality of rows, respectively, and a plurality of sets of first and second bit lines provided corresponding to said plurality of columns, respectively;

a sense amplifier provided corresponding to each set of the first and the second bit lines to amplify a potential difference generated between corresponding bit lines to a potential difference between said first power supply potential and said reference potential;

a row decoder to select one word line from said plurality of word lines according to a row address signal and to activate each memory cell corresponding to the selected word line;

first and second data lines commonly provided for said plurality of sets of first and second bit lines;

a plurality of sets of first and second column select lines provided corresponding to said plurality of sets of first and second bit lines, respectively;

a column decoder to select one set of first and second column select lines from said plurality of sets of first and second column select lines according to a column address signal and to turn the selected first and second column select lines to said first and second power supply potential, respectively;

a column select gate provided corresponding to each set of the first and the second bit lines, in response to an attainment of said first and second power supply potential by a corresponding first and second column select lines through said column decoder, respectively, to connect a corresponding first bit line and said first data line and to connect a corresponding second bit line and said second data line; and a read/write circuit connected to said first and second data lines to read/write a data signal of a memory cell selected by said row decoder and said column decoder; wherein said column select gate includes first and second transistors connected in series between a corresponding first bit line and said first data line, a gate electrode of one transistor of said first and second transistors is connected to said first column select line and a gate electrode of another transistor of said first and second transistors is connected to said second column select line, and third and fourth transistors connected in series between a corresponding second bit line and said second data line, a gate electrode of one transistor of said third and fourth transistors is connected to said first column select line and a gate electrode of another transistor of said third and fourth transistors is connected to said second column select line.

4. The semiconductor memory device according to claim 3, wherein said read/write circuit, at a write mask operation prohibiting data overwriting of said memory cell, turns each of said first and second data lines to said second power supply potential.

* * * * *